(12) United States Patent
Nishi et al.

(10) Patent No.: US 6,914,921 B2
(45) Date of Patent: Jul. 5, 2005

(54) OPTICAL FILTER, LASER MODULE, AND WAVELENGTH LOCKER MODULE

(75) Inventors: Yasuhiro Nishi, Tokyo (JP); Hideyuki Nasu, Tokyo (JP); Takehiko Nomura, Tokyo (JP); Hiroshi Matsuura, Tokyo (JP); Atsushi Shimizu, Tokyo (JP); Jun Yoshino, Tokyo (JP)

(73) Assignee: The Furukawa Electric Company, Ltd., Tokyo (JP)

( * ) Notice: Subject to any disclaimer, the term of this patent is extended or adjusted under 35 U.S.C. 154(b) by 54 days.

(21) Appl. No.: 10/260,068

(22) Filed: Sep. 27, 2002

(65) Prior Publication Data

US 2003/0081309 A1 May 1, 2003

(30) Foreign Application Priority Data

Sep. 28, 2001 (JP) .......................................... 2001-303731
Mar. 8, 2002 (JP) .......................................... 2002-064150

(51) Int. Cl.[7] ............................. H01S 3/00; G02B 6/34
(52) U.S. Cl. ........................................ 372/38.01; 385/27
(58) Field of Search ............................. 372/12, 32–34, 372/38.01, 100; 385/39, 27

(56) References Cited

U.S. PATENT DOCUMENTS

| | | | | |
|---|---|---|---|---|
| 4,517,456 A | * | 5/1985 | Halsall et al. | 250/226 |
| 4,713,820 A | * | 12/1987 | Morris et al. | 372/41 |
| 4,938,836 A | * | 7/1990 | Carenco et al. | 117/8 |
| 4,998,256 A | * | 3/1991 | Ohshima et al. | 372/32 |
| 6,078,598 A | * | 6/2000 | Ohtsuki et al. | 372/12 |
| 6,094,271 A | * | 7/2000 | Maeda | 356/394 |
| 6,259,711 B1 | * | 7/2001 | Laurell | 117/8 |
| 6,345,060 B1 | * | 2/2002 | Copner et al. | 372/32 |
| 6,469,593 B2 | * | 10/2002 | Nishizawa et al. | 333/133 |
| 6,483,735 B1 | * | 11/2002 | Rentzepis | 365/119 |
| 6,567,437 B1 | * | 5/2003 | Imaki et al. | 372/32 |
| 6,597,712 B2 | * | 7/2003 | Tatsuno et al. | 372/32 |
| 6,765,940 B2 | * | 7/2004 | Short | 372/32 |

FOREIGN PATENT DOCUMENTS

| | | | |
|---|---|---|---|
| EP | 0 818 857 | 1/1998 | |
| GB | 2 268 323 | 1/1994 | |
| JP | 2-257686 | 10/1990 | |
| JP | 2000101175 A | * 4/2000 | ............. H01S/3/11 |

OTHER PUBLICATIONS

Tatsuya Kimura, et al., "Temperature Compensation of Birefringent Optical Filters", Proceedings of the IEEE, vol. 59, No. 8, XP–001078997, Aug. 1971, pp. 1273–1274.

K. Tatsuno et al., "50 GHz SpaciNg, Multi–wavelength Tunable Locker Integrated in a Transmitter Module with a Monolithic–Modulator and a DFB–Laser" (2001) Technical Digest Series Conf. Ed. pp. TuB5–1 to TuB5–4.

* cited by examiner

*Primary Examiner*—Minsun Oh Harvey
*Assistant Examiner*—Phillip Nguyen
(74) *Attorney, Agent, or Firm*—Oblon, Spivak, McClelland, Maier & Neustadt, P.C.

(57) ABSTRACT

On a second thermo-module there are disposed a prism, an optical filter, and a sub-mount, via a base respectively. On the front side of the sub-mount, there are disposed a first photodetector and a second photodetector. The optical filter is structured with a crystal member that satisfies a condition that $\alpha + (1/n_0) \times (\Delta n / \Delta T)$ becomes not more than 3.5, where $\alpha$ is a coefficient of linear expansion, $n_0$ is a refractive index at a normal temperature, and $\Delta n$ is a change of a refractive index corresponding to a temperature variation $\Delta T$.

13 Claims, 17 Drawing Sheets

OPTICAL FILTER, LASER MODULE, AND WAVELENGTH LOCKER MODULE

BACKGROUND OF THE INVENTION

1) Field of the Invention

The present invention relates to a technical field of an optical module such as a semiconductor laser device module that is used for an optical transmitter that transmits an optical signal. More particularly, this invention relates to an optical filter, a semiconductor laser device module, and a wavelength locker module that have a function of monitoring the wavelength of a laser beam that bears an optical signal transmitted in a wavelength division multiplexing (WDM) communication system.

2) Description of the Related Art

In recent years, the WDM has been focused as an element technique that is used to dramatically increase the quantity of transmission information, in the optical communications field. In this WDM communication system, wavelength intervals between multiplexed optical signals become extremely short. On the other hand, the wavelength of a semiconductor laser device that is used as a signal light source varies due to a temperature variation or the like. Therefore, there is a risk that the quality of signals is degraded due to the occurrence of crosstalk between adjacent optical signals. Consequently, because of the need for preventing the crosstalk between optical signals, the semiconductor laser device that is used in the WDM communication system has been required to have very high wavelength stability.

As a technique for realizing this wavelength stability, there is known a semiconductor laser device module that is structured to use a wavelength locker that detects a wavelength of an optical signal and feeds back the wavelength to a semiconductor laser device. According to this semiconductor laser device module, the oscillation wavelength of the semiconductor laser device is properly controlled based on a variation in the wavelength of the optical signal detected by the wavelength locker. Therefore, the semiconductor laser device module operates to keep the wavelength of an optical signal always stable.

FIG. 18 is a view that shows a structure of a semiconductor laser device module that includes a conventional wavelength locker. The semiconductor laser device module shown in FIG. 18 is constructed of a semiconductor laser device 101 that emits a laser beam, an optical fiber 102 that transmits a laser beam to the outside, parallel lenses 103 and 104 and a condenser lens 105 that are disposed as optical lenses to transmit a laser beam, a beam splitter 106 that branches a laser beam into two, a resonator 107 that has a function of selectively transmitting a laser beam having a predetermined wavelength band based on resonance, and a first photodetector 108 and a second photodetector 109 that receive laser beams and output optical detection currents. In the example shown in FIG. 18, constituent members are integrally fitted to a package of the semiconductor laser device module, and are held by a plurality of carriers (indicated as shaded portions).

In the above structure, a laser beam emitted from the front end (right side in the drawing) of the semiconductor laser device 101 is changed into a parallel beam by the parallel lens 103, and the parallel beam is condensed by the condenser lens 105. The condensed beam is incident to the optical fiber 102. On the other hand, a laser beam emitted from the rear end (the left side in the drawing) of the semiconductor laser device 101 is changed into a parallel beam by the parallel lens 104. The parallel beam is branched into two directions by the beam splitter 106 that is disposed in slanting relative to the light axis.

The laser beam branched to a direction in which the laser beam is transmitted through the beam splitter 106 passes through the resonator 107, and is received by the first photodetector 108. Further, the laser beam branched to a direction in which the laser beam is reflected by the beam splitter 106 is received by the second photodetector 109. The resonator 107 works to transmit a laser beam that has a specific wavelength component that is determined by a structure and characteristics of the laser beam.

A first optical detection signal output from the first photodetector 108 is compared with a second optical detection signal output from the second photodetector 109. Based on an output ratio of the two currents, a wavelength variation of the laser beam emitted from the semiconductor laser device 101 is detected. Based on a result of this detection, it is possible to control a laser beam to stabilize its wavelength, by giving a desired temperature change to the semiconductor laser device 101 with a Peltier device or by changing an injection current to the semiconductor laser device 101.

In the above conventional semiconductor laser device module, an optical filter that uses a Fabry-Perot etalon is known as a resonator of the wavelength locker. This optical filter is a device that forms a reflection surface on both sides of an optical transmission medium, and makes a transmitted laser beam generate a Fabry-Perot resonance. For example, an optical filter that uses quartz glass or crystal is used as an optical transmission medium.

However, according to the semiconductor laser device module that uses an optical filter, there is a problem of the occurrence of variation in the wavelength transmission characteristics of the optical filter due to changes in the environmental temperature. Specifically, a resonance wavelength varies depending on the change in the optical length of the optical transmission medium of the optical filter, and this generates a trouble in accurately controlling the wavelength with the wavelength locker. Particularly, when the optical filter using quartz glass is employed, as a variation in the optical length attributable to a temperature variation is large, the resonance wavelength also varies large due to the temperature. As a result, when the semiconductor laser device module is used in a situation in which the environmental temperature is changed, the precision of the wavelength locking is lowered. The reduction in the precision of the wavelength locking becomes serious particularly when the wavelength intervals between optical signals are short.

SUMMARY OF THE INVENTION

It is an object of this invention to provide an optical filter that can stably carry out a wavelength locking in high precision even when the wavelength intervals between optical signals are short and when there is a large temperature change like in the WDM communication system, and provide a semiconductor laser device module and a wavelength locker module that use this optical filter as a resonator.

In order to achieve the above object, according to one aspect of the present invention, there is provided an optical filter comprising a crystal member that satisfies a condition that $\alpha + (1/n_0) \times (\Delta n/\Delta T)$ becomes not more than 3.5, where $\alpha$ represents a coefficient of linear expansion, $n_0$ represents a refractive index at a normal temperature, and $\Delta n$ represents a change of a refractive index corresponding to a temperature variation $\Delta T$.

Therefore, it is possible to provide an optical filter of which transmission wavelength has low dependency on temperature, and which restricts a variation in the transmission wavelength characteristics attributable to a temperature change.

According to another aspect of the invention, there is provided a laser module comprising, a semiconductor laser device that outputs a laser beam, an optical fiber that condenses a laser beam output from the semiconductor laser device and transmits the laser beam to the outside, an optical branching unit that makes a wavelength-monitoring laser beam incident out of a laser beam emitted from the semiconductor laser device, and branches the wavelength-monitoring laser beam into a first branch beam and a second branch beam, an optical filter that includes a crystal member that makes the first branch beam generate a Fabry-Perot resonance to selectively transmit a predetermined wavelength band, and that satisfies a condition that $\alpha+(1/n_0)\times(\Delta n/\Delta T)$ becomes not more than 3.5, where $\alpha$ represents a coefficient of linear expansion, $n_0$ represents a refractive index at a normal temperature, and $\Delta n$ represents a change of a refractive index corresponding to a temperature variation $\Delta T$, a first light amount detecting unit that receives a transmission beam of the optical filter, and a second light amount detecting unit that receives the second branch beam.

According to still another aspect of the invention, there is provided a wavelength locker module comprising, an optical branching unit that makes a wavelength-monitoring laser beam incident, and branches the wavelength-monitoring laser beam into a first branch beam and a second branch beam, an optical filter that includes a crystal member that makes the first branch beam generate a Fabry-Perot resonance to selectively transmit a predetermined wavelength band, and that satisfies a condition that $\alpha+(1/n_0)\times(\Delta n/\Delta T)$ becomes not more than 3.5, where $\alpha$ represents a coefficient of linear expansion, $n_0$ represents a refractive index at a normal temperature, and $\Delta n$ represents a change of a refractive index corresponding to a temperature variation $\Delta T$, a first light amount detecting unit that receives a transmission beam of the optical filter, and a second light amount detecting unit that receives the second branch beam.

These and other objects, features and advantages of the present invention are specifically set forth in or will become apparent from the following detailed descriptions of the invention when read in conjunction with the accompanying drawings.

DETAILED DESCRIPTIONS

Figure 1:
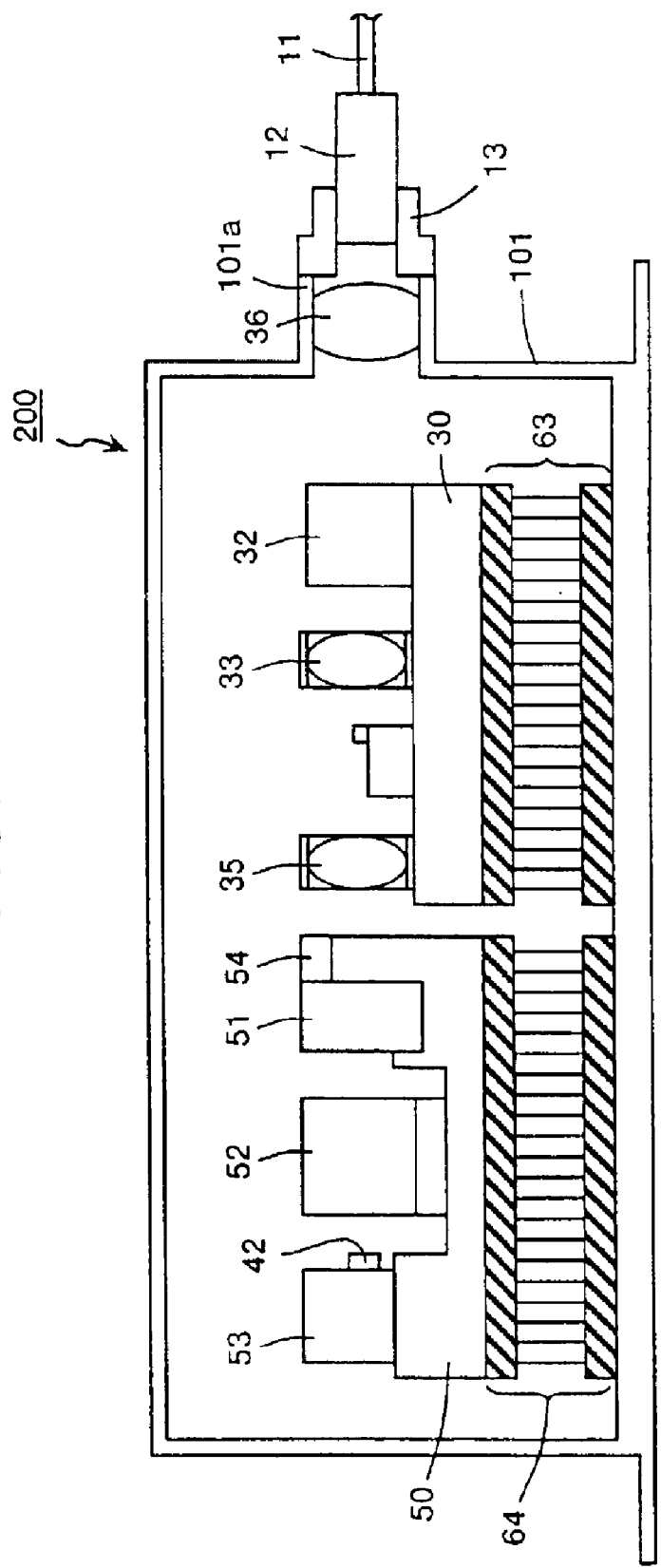
FIG. 1 is a side cross-sectional view that shows a structure of a laser module relating to a first embodiment.
Figure 2:
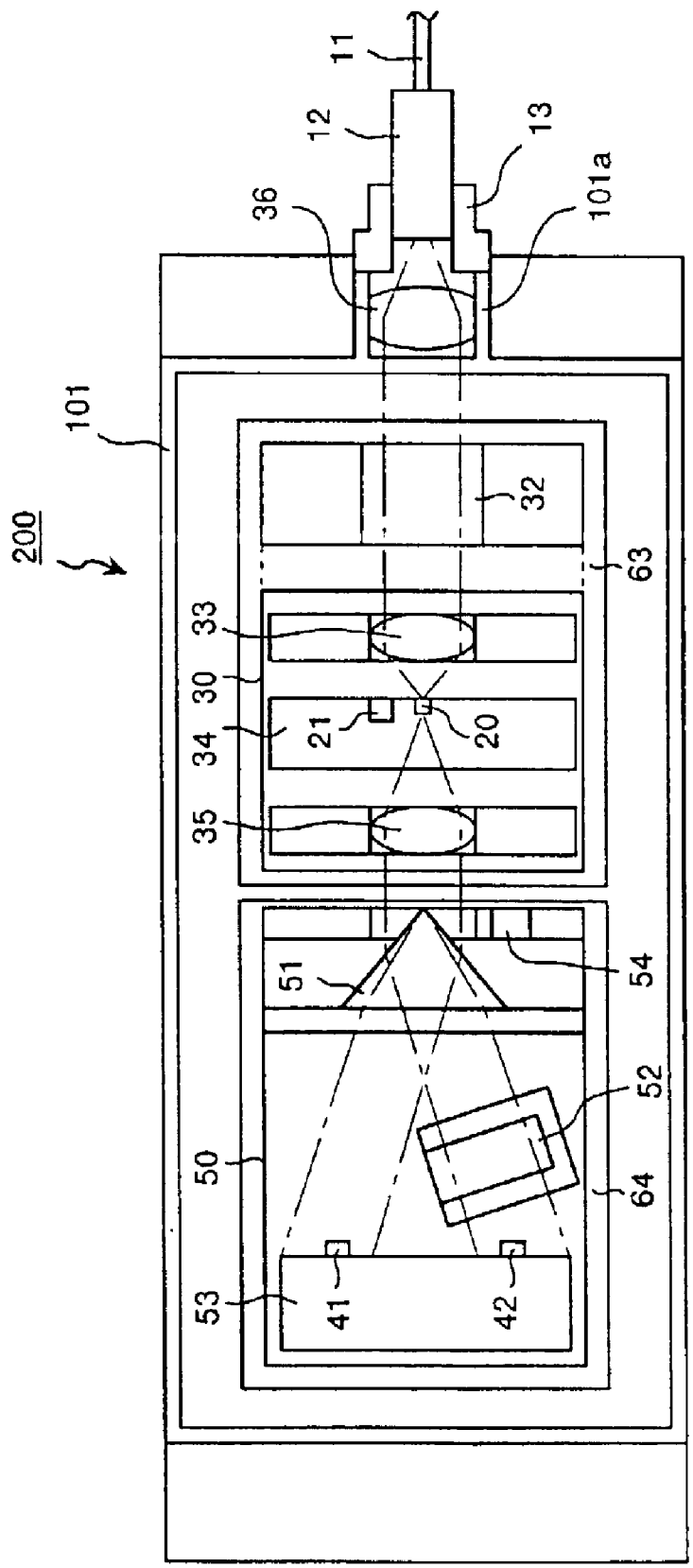
FIG. 2 is a top plan cross-sectional view that shows a structure of the laser module relating to the first embodiment.

A first embodiment will be explained below. FIG. 1 is a side cross-sectional view of a laser module relating to the first embodiment in a laser beam emission direction, and FIG. 2 is a top plan cross-sectional view shown in FIG. 1. A laser module 200 shown in FIG. 1 and FIG. 2 has an optical fiber 11 that receives a laser beam emitted from a semiconductor laser device 20 and transmits this laser beam. A front end of the optical fiber 11 is fixed to an end surface of a cylindrical portion 101a at an end of a package 101 in a laser beam emission direction via a sleeve 13 in a state that the front end of the optical fiber 11 is held with a ferrule 12.

A first thermo-module 63 and a second thermo-module 64 are disposed close to each other on a bottom surface of the package 101. The first thermo-module 63 and the second thermo-module 64 are devices of which surface can be heated or cooled based on a size and a direction of current conducted to these thermo-modules. Each thermo-module is constructed of a Peltier device or the like.

A base 30 made of CuW or the like is mounted on the first thermo-module 63. On this base 30, there are provided a sub-mount 34 that is mounted with the semiconductor laser device 20, a parallel lens 33 that changes a laser beam output from a front end surface of the semiconductor laser device 20 into a parallel beam, an optical isolator 32 that stops a return beam reflected from the optical fiber 11, and a parallel lens 35 that changes a monitoring-laser beam output from a rear end surface of the semiconductor laser device 20 into a parallel beam.

A condenser lens 36 that connects the parallel beam to the optical fiber 11 is fixedly accommodated in the cylindrical portion 101a at the end of the package 101 in a laser beam emission direction.

A base 50 made of CuW or the like is mounted on the second thermo-module 64. On this base 50, there are provided a prism 51 that branches the monitoring-laser beam output from the rear end surface of the semiconductor laser device 20 into two directions at a predetermined angle, an optical filter 52 that makes incident one of the beams obtained by branching by the prism 51, and a sub-mount 53. On the same plane of the front surface (the surface of a laser beam emission direction) of the sub-mount 53, there are provided a first photodetector 41 that receives the other beam obtained by branching by the prism 51, and a second photodetector 42 that receives a beam transmitted through the optical filter 52. A photodiode is used for each of the first photodetector 41 and the second photodetector 42.

A thermistor 54 that detects a temperature of the optical filter 52 is provided near the optical filter 52. Hereinafter, optical parts that are used to monitor the laser beam emitted from the semiconductor laser device 20 (for example, the parallel lens 35, the prism 51, the optical filter 52, the first photodetector 41, the second photodetector 42, and the thermistor 5) will be collectively called a wavelength monitor.

In the above structure of the laser module 200, a laser beam output from the front end surface of the semiconductor laser device 20 is transmitted to the optical fiber 11 via the parallel lens 33, the optical isolator 32, and the condenser lens 36. This laser beam is utilized as a signal beam for a desired application.

As the optical isolator 32 prevents a reflection return beam, the laser oscillation of the semiconductor laser device 20 is maintained at a stable level.

Figure 3:
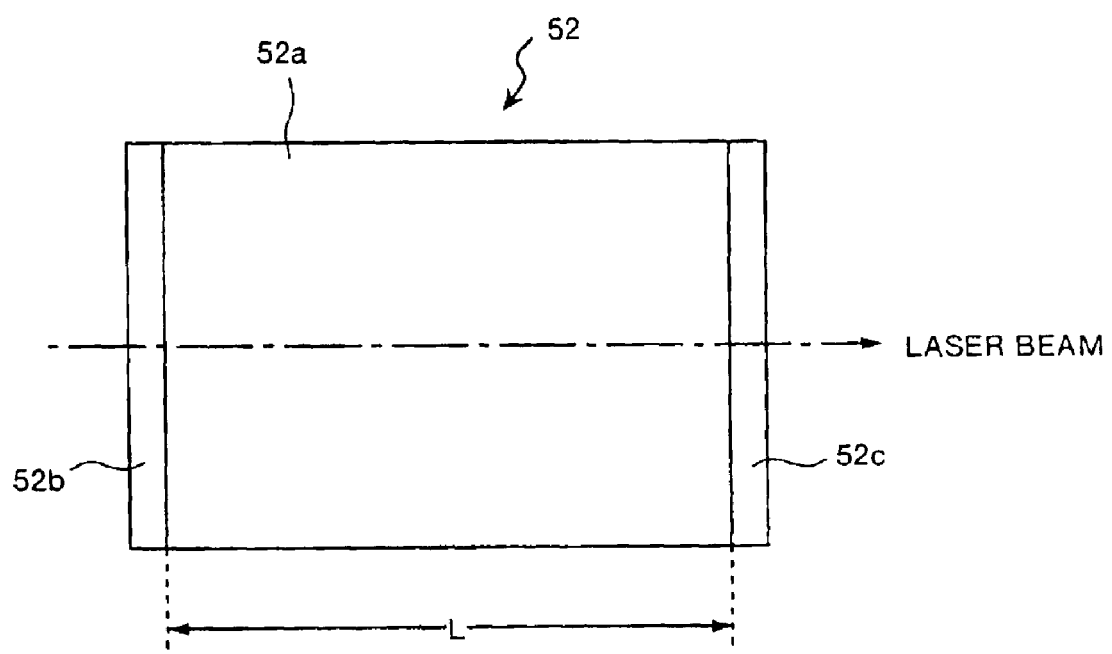
FIG. 3 is a view that shows a structure of an optical filter that constitutes the laser module relating to the first embodiment.

A structure and work of the optical filter 52 relating to the present embodiment will be explained next. FIG. 3 is a view that shows a structure of the optical filter 52. As shown in FIG. 3, the optical filter 52 is formed in a structure that a reflection film is formed on each of side surfaces 52b and 52c of a bulk-type crystal member 52a. The crystal member 52a is formed using a crystal that has characteristics to be described later. An optional reflectance is set to both side surfaces 52b and 52c. It is preferable that the side surfaces 52b and 52c are formed using a transparent material. A laser beam is incident perpendicularly to the side surface 52b of the optical filter 52 at the left side of the drawing, and is transmitted through the crystal member 52a. A part of the laser beam is transmitted through the side surface 52c, and is emitted perpendicularly from this surface to proceed to the right side of the drawing. The rest of the laser beam is reflected from the side surface 52c toward the side surface 52b.

The intensity of the laser beam emitted from the side surface 52c depends on the reflectance of the side surface 52c. For example, when the reflectance of the side surface 52c is 50%, the intensity of the emitted laser beam is 50% of the intensity of the laser beam that is incident to the side surface 52c. The intensity of the laser beam that is reflected from the side surface 52c to the side surface 52b becomes the rest 50%. Based on this structure, the laser beam that is transmitted through the crystal member 52a generates multiple interference between the two side surfaces 52b and 52c. Therefore, it is possible to periodically transmit a laser beam that has a specific wavelength band.

In the present embodiment, transmission wavelength characteristics that has preferable temperature dependency is provided to the optical filter 52, based on a selection of a crystal that is used as the crystal member 52a. Specifically, the crystal member 52a that constitutes the optical filter 52 satisfies the following condition:

$$\alpha + (1/n_0) \times (\Delta n/\Delta T) < 3.5 \qquad (1),$$

where $\alpha$ represents a coefficient of linear expansion, $n_0$ represents a refractive index at a normal temperature, and $\Delta n$ represents a change of a refractive index corresponding to a temperature variation $\Delta T$. When the optical filter 52 is structured by a crystal material that satisfies the above expression (1), it is possible to restrict a variation in the resonance wavelength that is attributable to a variation in the environmental temperature. For the crystal materials, it is possible to use any one of $LiTaO_3$, $LiNbO_3$, $Bi_{12}GeO_{20}$, $Gd_3Ga_5O_{12}$, and $TeO_2$. These crystal materials have the refractive index $n_0$ of 2.0 or above, and these crystal materials are not easily affected by temperature variation.

The temperature dependency of the optical characteristics of the optical filter 52 made of the above crystal material will be explained. When the angle of incidence of a laser beam to the optical filter 52 is zero degree, the optical length L can be given by the following expression:

$$L = \{n_0 + (\Delta n/\Delta T) \cdot (T - T_0)\} \cdot L_0 \cdot (1 + \alpha(T - T_0)) = n_0 \cdot L_0[(T - T_0) \cdot \{\alpha + (1/n_0) \cdot (\Delta n/\Delta T)\}] \qquad (2),$$

where T represents a temperature, $T_0$ represents a normal temperature, and $L_0$ represents an optical length. Other symbols are similar to those in the expression (1). This expression (2) shows that the optical length L of the laser beam incident to the optical filter 52 expands or contracts from the original optical length $L_0$ at the normal temperature, attributable to the temperature dependency. From the expression (2), it can be known that when $\{\alpha + (1/n_0) \cdot (\Delta n/\Delta T)\}$ becomes smaller, the influence of a temperature change to the optical length L becomes smaller.

In the expression (2), the following parameter $\gamma$ will be defined:

$$\gamma = \alpha + (1/n_0) \cdot (\Delta n/\Delta T) \qquad (3).$$

Based on $\gamma$, it is possible to decide an influence level of temperature change to a crystal material. $\gamma$ becomes about $7 \times 10^{-6}$/deg, for quartz as a general crystal material that is used for the optical filter 52. On the other hand, the parameter $\gamma$ becomes smaller than that of crystal, for each of the above crystal materials that are used for the optical filter 52 relating to the present embodiment. The parameter $\gamma$ values of the above crystal materials are shown below.

| | |
|---|---|
| $LiNbO_3$ (C axis) | $\gamma = 2.3$ ($\times 10^{-6}$/deg) |
| $LiTaO_3$ (C axis) | $\gamma = 1.3$ ($\times 10^{-6}$/deg) |
| $Bi_{12}GeO_{20}$ | $\gamma = 1.0$ ($\times 10^{-6}$/deg) |
| $Gd_3Ga_5O_{12}$ | $\gamma = 3.0$ ($\times 10^{-6}$/deg) |
| $TeO_2$ (C axis) | $\gamma = 1.7$ ($\times 10^{-6}$/deg) |

As the above five crystal materials have sufficiently smaller parameter $\gamma$ values than that of crystal, a wavelength deviation following a temperature variation becomes smaller. For example, when the temperature has been raised from 25° C. to 40° C., the wavelength deviation of $LiTaO_3$ becomes smaller than the wavelength deviation of crystal.

Figure 4A:
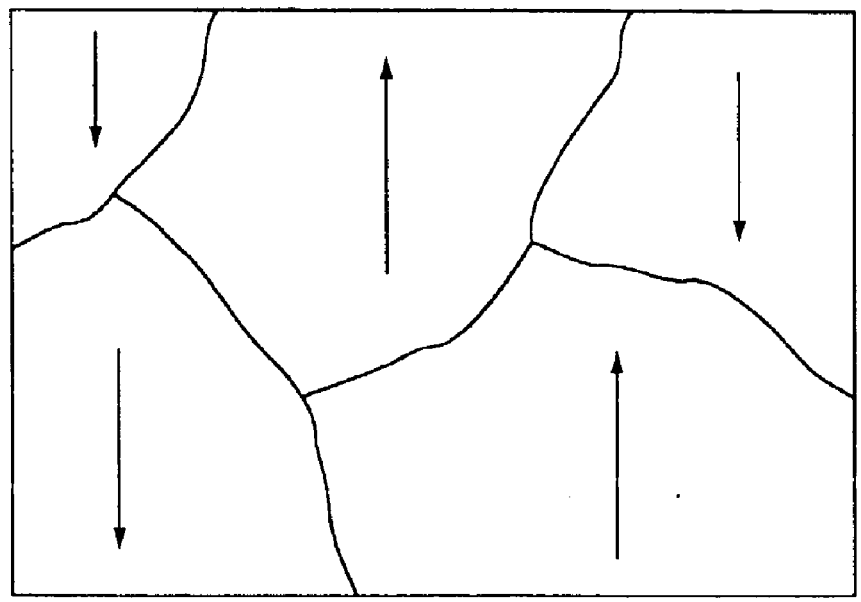
FIG. 4A shows a state of electric dipoles on the surface of a crystal material when a polarization processing has not been carried out and FIG. 4B shows a state of electric dipoles on the surface of a crystal material when a polarization processing has been carried out or when the crystal material has been annealed at or above a Curie point after providing a polarization processing.
Figure 4B:
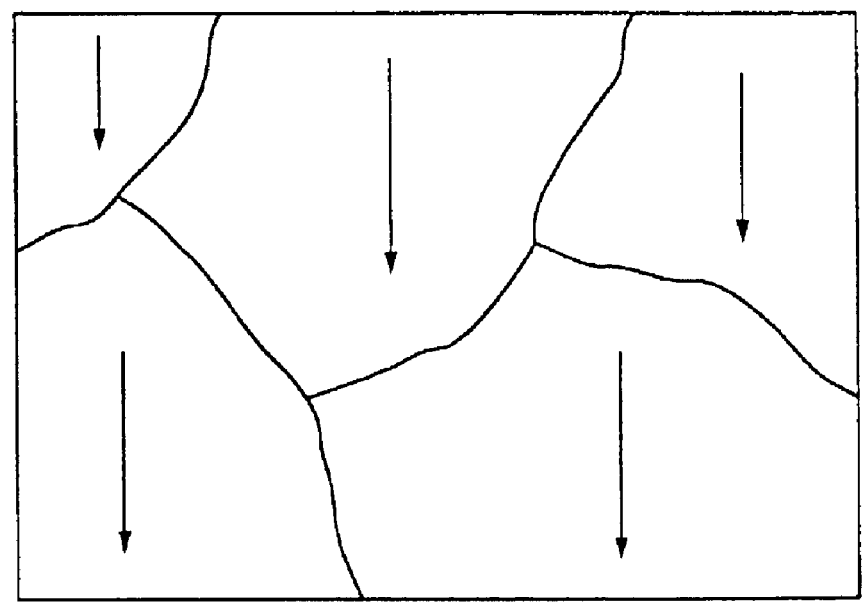

While a polarization processing is carried out in the processing of a ferroelectric crystal material in general, the polarization processing is not carried out in the present embodiment. The polarization processing means the application of a DC strong field to a crystal material at a high temperature, for example. This is the processing of arranging electric dipoles to a constant direction inside the crystal material. A change in the state of electric dipoles depending on presence or absence of a polarization processing will be explained below using FIG. 4A and FIG. 4B. FIG. 4A is a schematic view that shows a state of electric dipoles on the surface of a crystal material when a polarization processing has not been carried out. FIG. 4B is a schematic view that shows a state of electric dipoles on the surface of a crystal material when a polarization processing has been carried out. Usually, in the ferroelectric crystal material like $LiTaO_3$, directions of the electric dipoles are different between polarization domains, as shown in FIG. 4A. Therefore, in order to make clear a predetermined characteristic, it has been a common practice to carry out a polarization processing to the crystal material thereby to make constant the directions of the electric dipoles in the polarization domains, as shown in FIG. 4B. However, the inventors of the present invention have found that the temperature characteristic of the optical filter further improves when a crystal material that has substantially zero dipole moment as a whole is used for the material of the optical filter, without carrying out a polarization processing to the crystal material. For example, a wavelength deviation of $LiTaO_3$ under the above condition becomes smaller when a polarization processing has not been carried out than a wavelength deviation when a polarization processing has been carried out, at the same temperature. When the temperature is lowered from 40° C. to 25° C., reproducibility improves further.

Figure 5A:
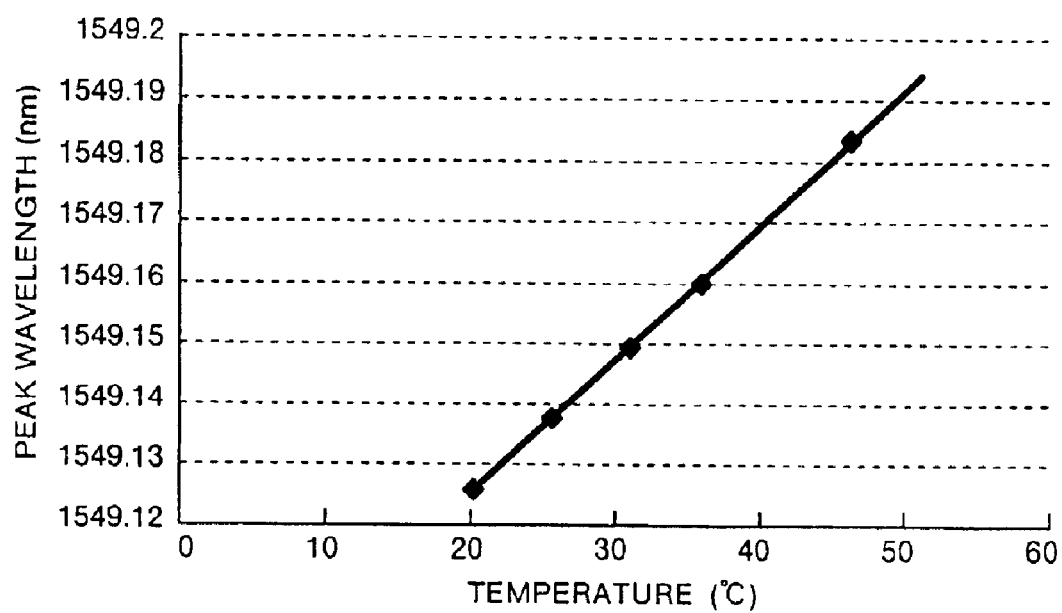
FIG. 5A and FIG. 5B are graphs that respectively show temperature dependency of transmission wavelength characteristics of a crystal material that constitutes an optical filter.
Figure 5B:
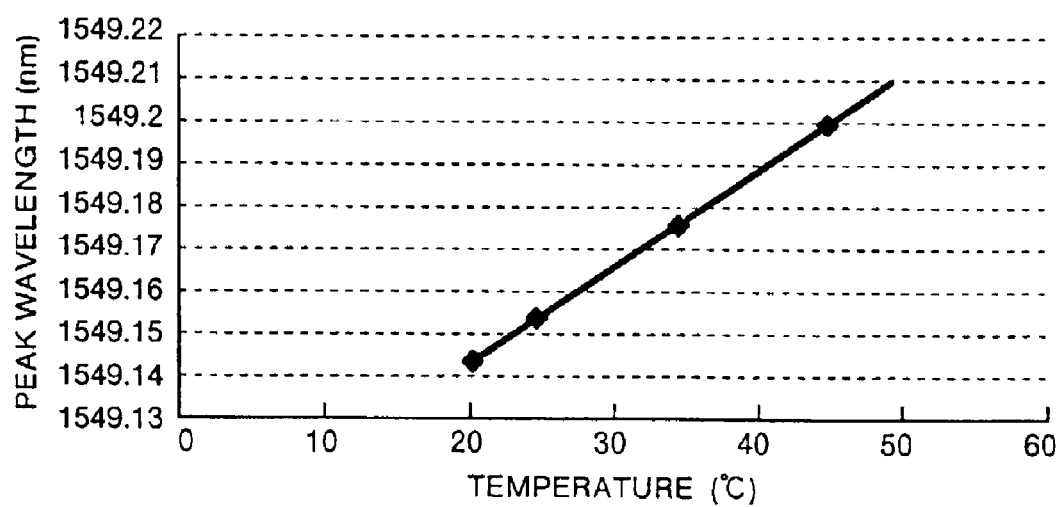

The inventors of the present invention have checked the temperature dependency of a transmission wavelength by using $LiTaO_3$ as a crystal material and after carrying out a predetermined processing to this $LiTaO_3$. FIG. 5A and FIG. 5B are graphs that respectively show temperature dependency of a transmission wavelength of a crystal material when $LiTaO_3$ has been cut into a 15 mm by 15 mm square piece without carrying out a polarization processing after this $LiTaO_3$ has been annealed. The crystal material has been measured by raising the temperature from 20° C. to 45° C. As a result of measuring the sample, as shown in FIG. 5A, peak wavelengths of a transmission beam have been 1549.1263 nm, 1549.1375 nm, 1549.1484 nm, 1549.1600 nm, and 1549.1840 nm at measurement temperatures of 20° C., 25° C., 30° C., 35° C., and 45° C., respectively. The measured values are plotted and fitted on the graph. As a result, the inclination of an obtained straight line is very small of 0.00230 (nm/° C.), which shows that a change of a transmission wavelength following a change in temperature is very small. After carrying out the measurement in the above range of temperature, the temperature of the sample has been lowered to 25° C., and a peak length of a transmission beam has been measured again. The obtained peak length has been 1549.1381 nm, which has an extremely small deviation of 0.0006 nm from the first measured value of the sample at 25° C. This shows that according to this sample used for the above measurement, a transmission wavelength of the sample has low temperature dependency, and the sample is also extremely excellent in the reproducibility of the transmission wavelength. This satisfactory reproducibility becomes an excellent advantage in actually using the optical filter in the laser module.

FIG. 5B is a graph for comparison with FIG. 5A. FIG. 5B shows a result of measuring the temperature dependency of a transmission wavelength of a separate sample manufactured under the same condition as that of the sample used for the measurement in FIG. 5A. The crystal material has been measured by raising the temperature. As a result of measuring the sample, peak wavelengths of a transmission beam have been 1549.1415 nm, 1549.1528 nm, 1549.1735 nm, and 1549.1965 nm at measurement temperatures of 20° C., 25° C., 35° C., and 45° C., respectively. The measured values are fitted on the graph. As a result, the inclination of an obtained straight line is 0.00219 (nm/° C.), which is a better value than the measured result shown in FIG. 5A. After raising the temperature to 45° C., the temperature of the sample has been lowered to 25° C., and a peak length of a transmission beam has been measured again. The value has been 1549.1523 nm. The deviation of the peak wavelength before and after the temperature raise has been 0.0108 nm. Although this difference is not smaller than the difference obtained in FIG. 5A, this shows excellent reproducibility.

Figure 6:
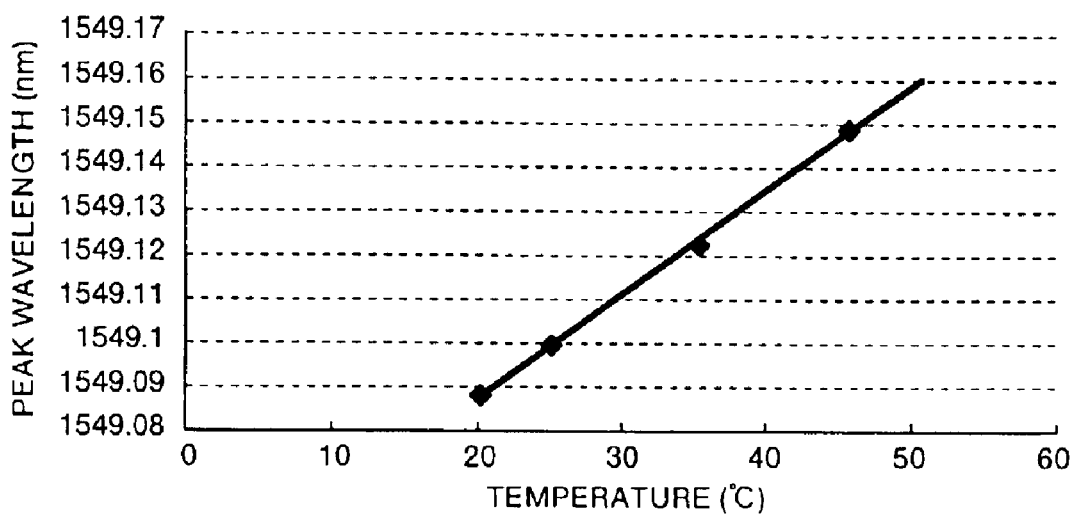
FIG. 6 is a graph that shows temperature dependency of transmission wavelength characteristics of a crystal material after the crystal material has been disconnected and annealed.

The inventors of the present invention have checked the temperature dependency of a transmission wavelength by using $LiTaO_3$. After annealing and cutting this crystal material in a similar manner to that of the measurement shown in FIG. 5A and FIG. 5B, the crystal material is annealed again at a temperature 700° C., and then the temperature dependency of a transmission wavelength is measured. FIG. 6 shows a result of this measurement. The crystal material has been measured by raising the temperature. As a result of measuring the sample, peak wavelengths of a transmission beam have been 1549.0883 nm, 1549.0984 nm, 1549.1220 nm, and 1549.1478 nm at measurement temperatures of 20° C., 25° C., 35° C., and 45° C., respectively. As a result of measurement, the inclination of an obtained straight line is small that is 0.00240 (nm/° C.). After the temperature of the sample has been lowered to 25° C., a peak wavelength of a transmission beam has been measured again. The obtained peak wavelength has been 1549.0990 nm. The deviation at 25° C. with the peak wavelength has been 0.0006 nm. This shows excellent reproducibility.

Figure 7:
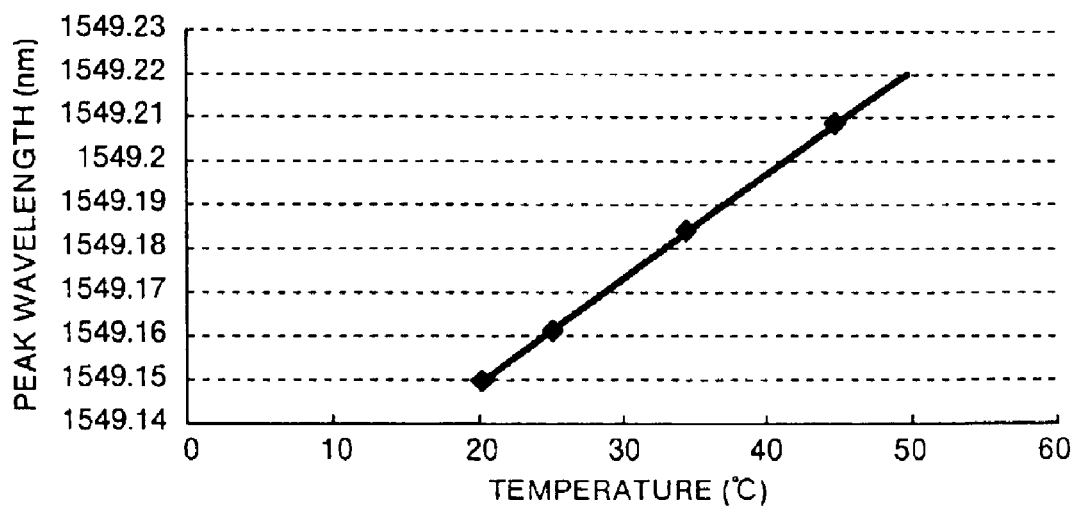
FIG. 7 is a graph that measures temperature dependency of transmission wavelength characteristics of a crystal material after the crystal material has been polarized and then disconnected and annealed.

The samples used in the above measurements shown in FIG. 5A, FIG. 5B, and FIG. 6 have been processed without a polarization processing. It is also possible to obtain excellent characteristic when a crystal material has been cut into a 15 mm by 15 mm square piece after carrying out a polarization processing, and the crystal material is annealed at a temperature of a Curie point or above. Specifically, the inventors of the present invention have carried out a polarization processing after annealing a crystal material. Then, the crystal material has been cut into a 15 mm by 15 mm square piece, and the crystal material has been annealed again at a temperature of 700° C., which is higher than a Curie point. The temperature dependency of a transmission wavelength of this crystal material has been measured. FIG. 7 shows a result of this measurement. The crystal material has been measured by raising the temperature. As a result of measuring the sample, peak wavelengths of a transmission beam have been 1549.1493 nm, 1549.1601 nm, 1549.1840 nm, and 1549.2085 nm at measurement temperatures of 20° C., 25° C., 35° C., and 45° C., respectively. The measured values are fitted on the graph. As a result, the inclination of an obtained straight line is 0.00237 (nm/° C.). The temperature of the sample has been lowered to 25° C., and a peak wavelength of a transmission beam has been measured again, which has been 1549.1607 nm. The deviation during the temperature rise with the temperature has been 0.0006 nm. This shows excellent reproducibility.

As explained above, when an optical filter is formed by using $LiTaO_3$ or the like that satisfies the expression (1) as a crystal material, it becomes possible to realize an optical filter that has excellent temperature characteristics with small variation in the transmission wavelength attributable to a temperature change. Particularly, when the crystal material is annealed again at a high temperature, without carrying out a polarization processing or after carrying out a polarization processing, the temperature characteristics of the crystal material become more excellent. As a result, it is possible to realize an optical filter having excellent temperature characteristics.

Temperature control of the laser module 200 that uses this optical filter 52 will be explained next.

A monitoring laser beam output from the rear end surface of the semiconductor laser device 20 is branched into two directions by the prism 51 via the parallel lens 35.

One of the beams obtained by branching by the prism 51 is converted into current by the first photodetector 41, and this current is used as a reference voltage by a current-voltage converter not shown.

The other beam obtained by branching by the prism 51 passes through the optical filter 52, and is converted into current by the second photodetector 42. This current is used as a signal voltage by a current-voltage converter not shown. A difference between a signal voltage obtained when a beam of a desired wavelength has passed through the optical filter 52 and the reference voltage will be called a reference voltage difference. When a voltage difference between the actual reference voltage and the signal voltage is compared with the reference voltage difference, it is possible to know a wavelength deviation. It is also possible to detect a wavelength deviation by using a voltage ratio instead of a voltage difference.

It is possible to correct this wavelength deviation by changing the temperature of the semiconductor laser device 20. In order to correct this deviation, the temperature of the sub-mount 34 below the semiconductor laser device 20 may be adjusted (either cooled or heated).

A voltage that shows a wavelength deviation obtained by the comparison is used as a control voltage for a controller not shown to control the temperature of the first thermo-module 63. The first thermo-module 63 is operated as a temperature adjuster. With this arrangement, the temperature of the semiconductor laser device 20 is controlled via the first thermo-module 63, the base 30, and the sub-mount 34, and the semiconductor laser device 20 is feedback controlled to restrict a wavelength variation, or to output a laser beam having a desired wavelength.

In order to correct the deviation of the wavelength of a laser beam that is output from the semiconductor laser device 20 and to keep the wavelength at a constant value, it is necessary that the wavelength of a laser beam that passes through the optical filter 52 keeps a constant value. For this purpose, the controller not shown calculates a difference between a desired temperature and a temperature detected by the thermistor 54, and controls the temperature of the second thermo-module 64 by using a voltage corresponding to this difference as a control voltage. As a result, the optical filter 52 is heated or cooled via the second thermo-module 64 and the base 50, and is stabilized at a desired temperature.

According to the laser module relating to the first embodiment, a material that satisfies the condition shown in the expression (1) is used for the crystal member 52a to form the optical filter 52. Therefore, the optical filter 52 has excellent temperature characteristics, and can make the variation width of a transmission wavelength attributable to a temperature change smaller than the conventional width. As a result, even when there is a slight variation in the temperature of the optical filter 52, it is possible to restrict the variation width of a transmission wavelength of the optical filter 52 to within a range that has no problem in practical application of the optical filter 52.

Therefore, according to the laser module relating to the first embodiment, the wavelength of the beam of which intensity is detected by the second photodetector 42 is kept at a constant level, and it is possible to accurately detect a difference between a signal voltage and a reference voltage. As a result, it is possible to keep the wavelength of the laser beam that is output from the semiconductor laser device 20 at a constant value in high precision.

In the first embodiment, the wavelength monitor is constructed of the prism 51 as a kind of a beam splitter, the first photodetector 41 and the second photodetector 42 that are disposed on the same plane of the sub-mount 53. The prism has a simple structure to branch one laser beam into two directions based on two inclined surfaces. It is possible to set an optional branch angle of a laser beam by setting an angle formed by the two inclined surfaces. Therefore, it is possible to provide a smaller wavelength monitor than other beam splitters. It is also possible to use other beam splitter, for example a half-mirror, in place of the prism 51. The first photodetector 41 and the second photodetector 42 that are provided on a separate sub-mount may receive a transmission beam and a reflection beam from the half-mirror.

Figure 8:
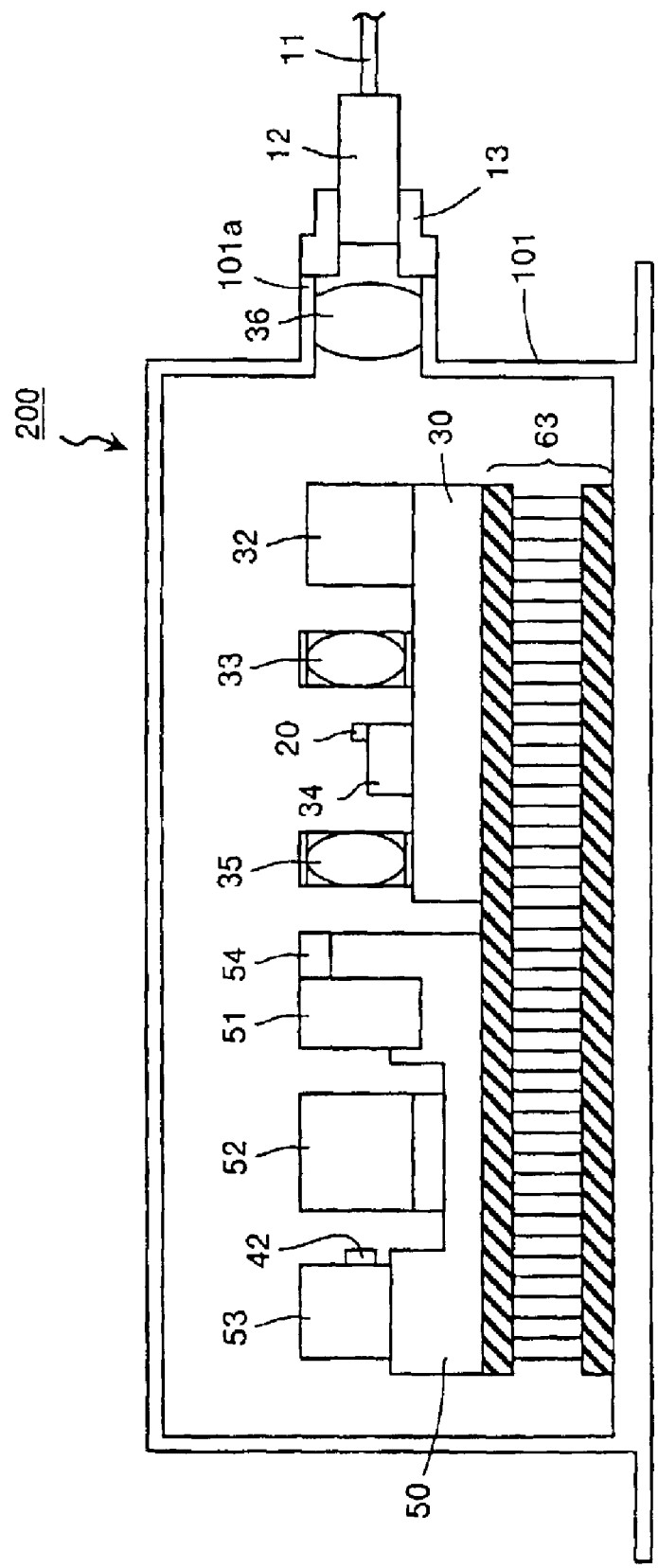
FIG. 8 is a side cross-sectional view that shows a structure of a laser module relating to a modification of the first embodiment.

When all the optical parts that are mounted on the first thermo-module 63 and the second thermo-module 64 are disposed on the first thermo-module 63 as shown in FIG. 8, this structure is advantageous to further reduce sizes of the laser module.

Figure 9:
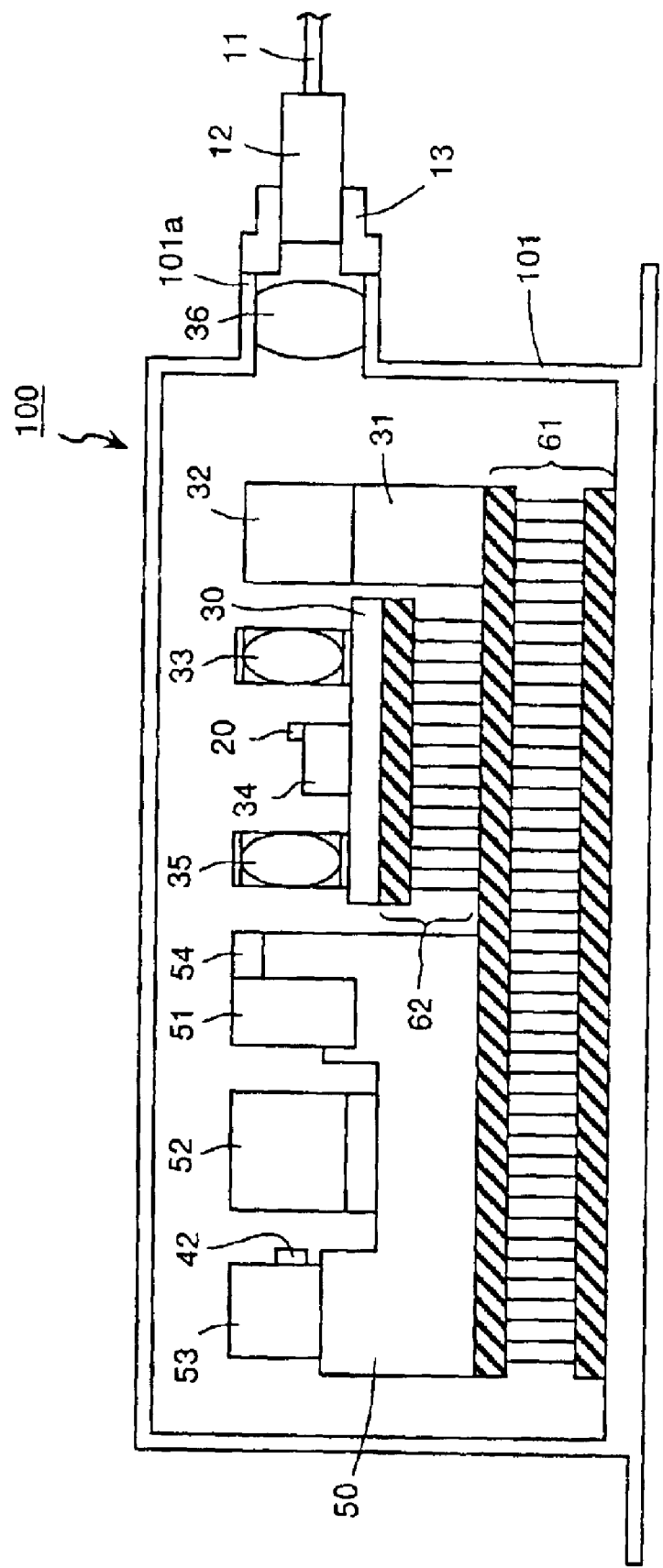
FIG. 9 is a side cross-sectional view that shows a structure of a laser module relating to a second embodiment.

A second embodiment will be explained next. FIG. 9 is a side cross-sectional view of a laser module in a laser beam emission direction. In FIG. 9, sections that are identical with those in FIG. 1 are attached with like reference numbers, and explanation of these sections will be omitted.

A laser module 100 shown in FIG. 9 is different from the laser module 200 shown in FIG. 1 in the following points. First, in the laser module 100 shown in FIG. 9, only a first thermo-module 61 is disposed on the bottom surface of a package 101. Second, a base that installs an optical isolator 23, a second thermo-module 62 and a base 50 that constitutes a wavelength monitor are provided on the first thermo-module 61. Third, a semiconductor laser device 20 and parallel lenses 33 and 35 are disposed on the second thermo-module 62. In the second embodiment, an optical filter 52 is also made of a crystal material that satisfies the expression (1). It is also preferable that a polarization processing is not carried out to this crystal material, or the crystal material is annealed at a high temperature after a polarization processing, like in the first embodiment.

Figure 10:
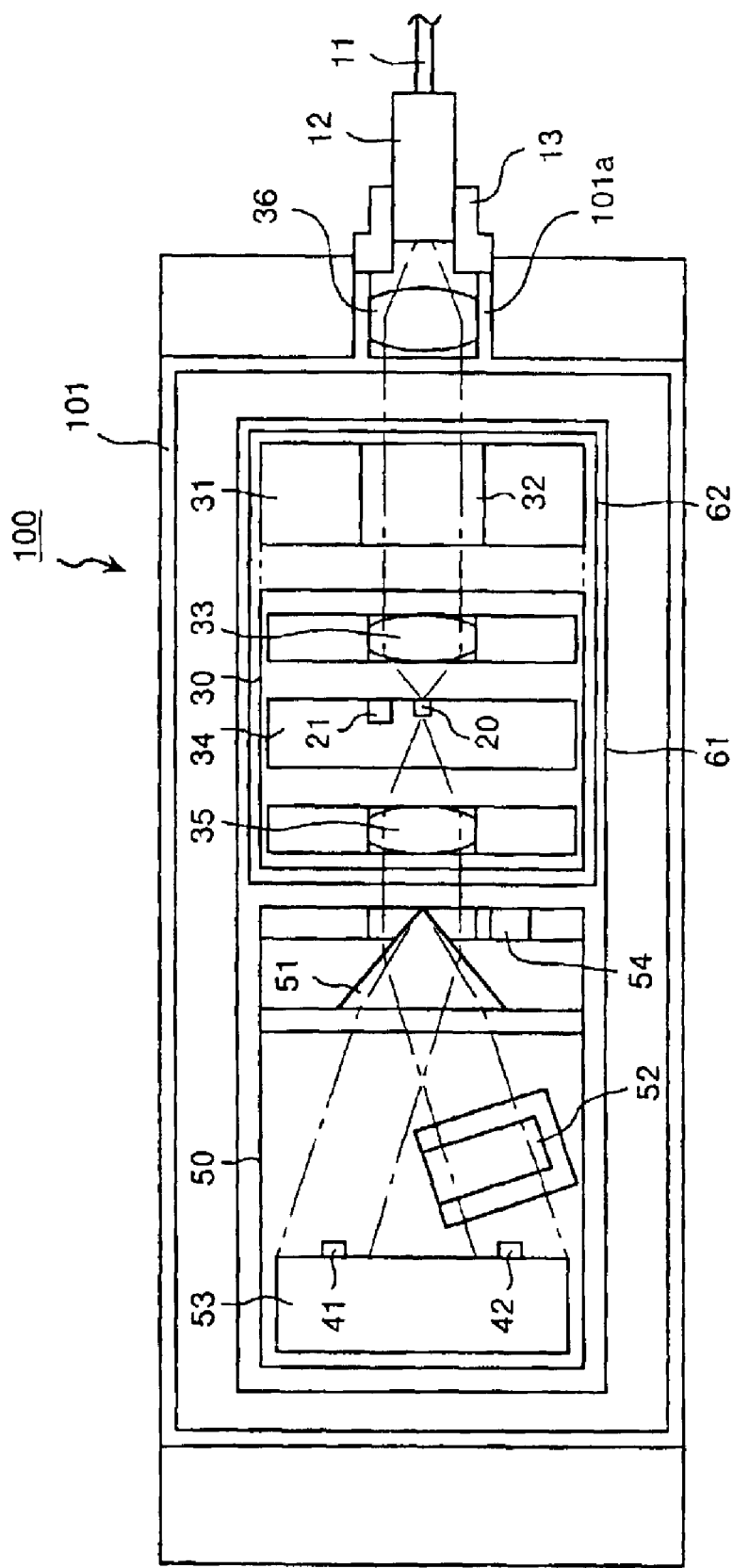
FIG. 10 is a top plan cross-sectional view that shows a structure of the laser module relating to the second embodiment

FIG. 10 is a top plan cross-sectional view of the laser module 100 in a laser beam emission direction. As shown in FIG. 10, the semiconductor laser device 20 and a thermistor 21 that measures a temperature of the semiconductor laser device 20 are provided on a sub-mount 34. A first photodetector 41 that receives the other beam obtained by branching a laser beam by the prism 51, and a second photodetector 42 that receives a beam transmitted through the optical filter 52 are provided on the same plane at the front surface (the surface in a laser beam emission direction) of the sub-mount 53 that is positioned on the wavelength monitor.

Figure 11:
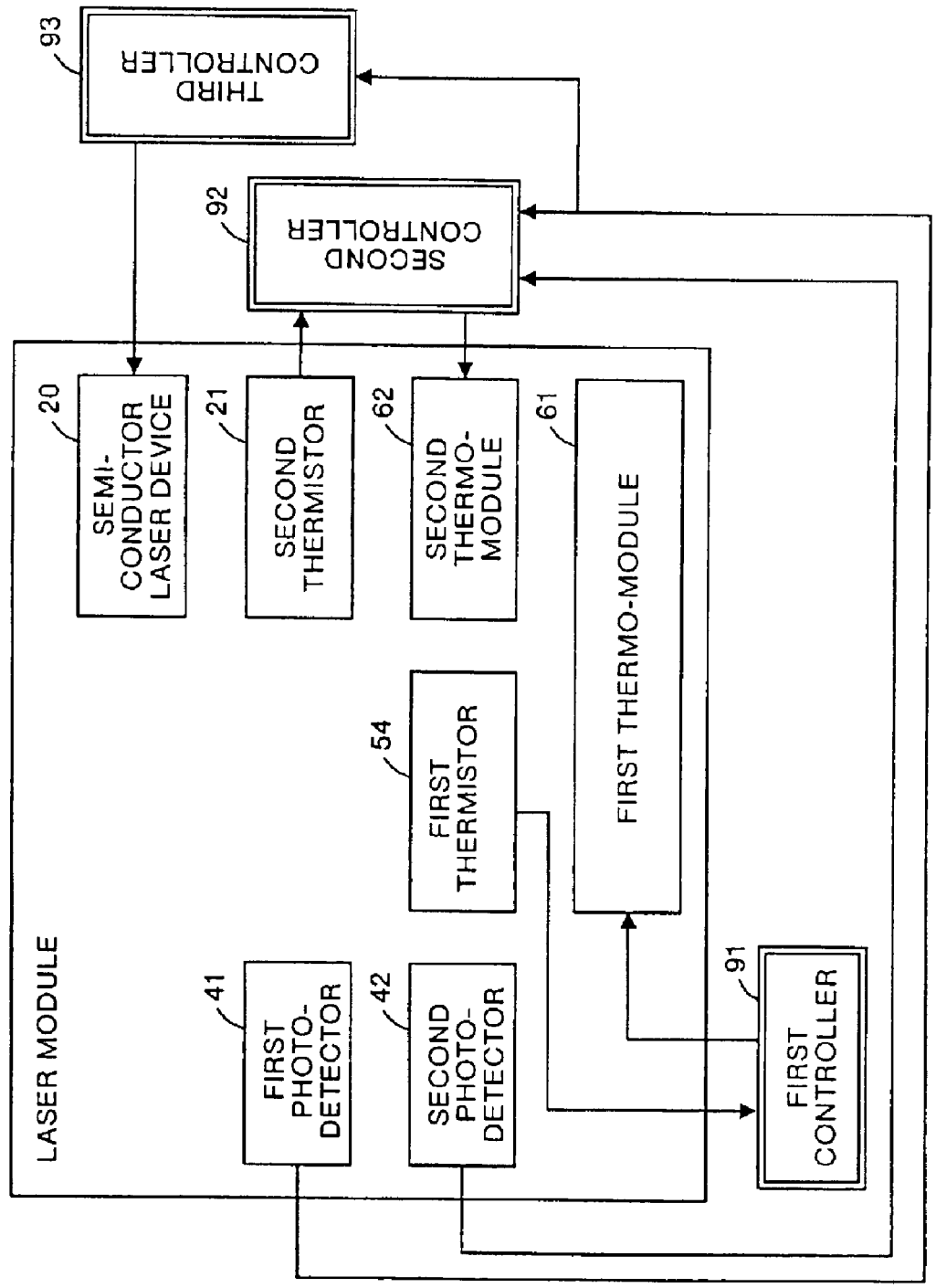
FIG. 11 is a block diagram that explains the operation of the laser module relating to the second embodiment.

Temperature control of this laser module 100 will be explained below. FIG. 11 is a diagram that explains the operation of the laser module. A thermistor 54 that measures a temperature of the optical filter 52 will be called a first thermistor 54, and a thermistor 21 that measures a temperature of the semiconductor laser device 20 will be called a second thermistor 21.

In FIG. 11, when a signal has been input from the first thermistor 54 to a first controller 91, the first controller 91 detects a temperature of the optical filter 52. The first controller 91 calculates a difference between a desired temperature and a temperature detected by the first thermistor 54, and controls the temperature of the first thermo-module 61 to a constant level by using a voltage corresponding to this difference as a control voltage. With this arrangement, the optical filter 52 is heated or cooled via the first thermo-module 61 and the base 50, and is stabilized at the desired temperature. In other words, it is possible to stabilize the wavelength discrimination characteristics of the optical filter 52.

When a signal has been input from the second thermistor 21 to a second controller 92 shown in FIG. 11, the second controller 92 detects a temperature of the semiconductor laser device 20. The second controller 92 stores a relationship between the temperature of the semiconductor laser device 20 and the oscillation wavelength. A user selects a desired wavelength, and sets this wavelength. Based on this, the second controller 92 controls the second thermo-module 62 to obtain a temperature corresponding to this desired wavelength.

On the other hand, the monitoring laser beam output from the rear end surface of the semiconductor laser device 20 is transmitted through the parallel lens 35, and is then incident to the two inclined surfaces that are formed on the prism 51 at different inclination angles. The incident laser beam is branched into two directions toward the first photodetector 41 and the second photodetector 42. One of the beams obtained by branching by the prism 51 is converted into current by the first photodetector 41, and this current is input to the second controller 92 shown in FIG. 11.

The other beam obtained by branching by the prism 51 is transmitted through the optical filter 52 and is converted into current by the second photodetector 42, and this current is input to the second controller 92 shown in FIG. 11.

The second controller 92 converts the current input from the first photodetector 41 into a voltage, and uses this voltage as a reference voltage. The second controller 92 converts the current input from the second photodetector 42 into a voltage, and uses this voltage as a signal voltage. The second controller 92 stores a reference voltage difference that is a difference between a signal voltage that is obtained when a beam of a desired wavelength selected by a user has passed through the optical filter 52 and the reference voltage obtained when the beam of this wavelength has oscillated. The second controller 92 can detect a wavelength deviation by comparing a voltage difference between the actual reference voltage and the signal voltage with the reference voltage difference.

Based on a voltage that shows this wavelength deviation, the second controller 92 controls the temperature of the second thermo-module 62. The semiconductor laser device 20 is cooled or heated via the first thermo-module 62, the base 30, and the sub-mount 34. In other words, the wavelength is locked to a desired wavelength selected by the user.

A third controller 93 shown in FIG. 11 controls an injection current of the semiconductor laser device 20 so that the laser beam output becomes constant, based on a signal output from the first photodetector 41.

The temperature variable performance of the laser module will be explained next. As one example, it will be assumed that a range of temperature within which it is possible to control the temperature of the first thermo-module 61 and the second thermo-module 62 is 60° C., and that a temperature specification of a case of the laser module is required to be −5° C., to 70° C. In this case, the temperature variable range of the first thermo-module 61 becomes 10° C. to 55° C. Therefore, it is sufficiently possible to keep the temperature of the optical filter 52, that is the temperature of the first thermo-module 61, to 20° C., for example, with the first controller 91.

In this state, as the temperature of the first thermo-module 61 at the lower stage of the second thermo-module 62 is controlled to be constant, it is possible to remarkably expand a temperature variable range of the second thermo-module 62 as compared with the conventional range. For example, when the temperature of the first thermo-module 61 is 20° C. like in the above example, the temperature variable range of the second thermo-module 62 becomes −40° C. to 80° C. with a width of 120° C. This means that it is possible to control the temperature of the semiconductor laser device 20 over the range of 120° C. via the sub-mount 34 that is provided on the second thermo-module 62.

As the temperature dependency of the oscillation wavelength of the semiconductor laser device 20 is about 0.1 nm/° C., the wavelength variable range of the semiconductor laser device 20 becomes 0.1 nm×120° C.=12 nm. As a result, it becomes possible to expand the application range of this laser module.

According to the second embodiment, as the optical filter 52 is provided on the first thermo-module 61 of which temperature is controlled to a constant level, it is possible to stabilize the wavelength discrimination characteristics of the optical filter 52 and the optical isolator 32. Therefore, it is possible to realize wavelength locking more precisely. Further, as the second thermo-module 62 is provided on the first thermo-module 61 of which temperature is controlled to a constant level, it becomes possible to expand the temperature control range of the second thermo-module 62. Therefore, it becomes possible to expand the wavelength variable range of the semiconductor laser device 20 that is provided on the second thermo-module 62 via the base 30 and the sub-mount 34.

According to the second embodiment, the optical filter 52 has a structure similar to that of the optical filter explained in the first embodiment, and also satisfies the condition of the expression (1). Therefore, the temperature dependency of the wavelength of the transmission beam of the optical filter 52 becomes smaller than that of the conventional optical filter. Consequently, it is possible to detect in high precision a wavelength variation of a laser beam that is output from the semiconductor laser device 20. Based on this wavelength variation, the first thermo-module 61 and the second thermo-module 62 can control the temperature of the semiconductor laser device 20, and can precisely control the output wavelength.

Figure 12:
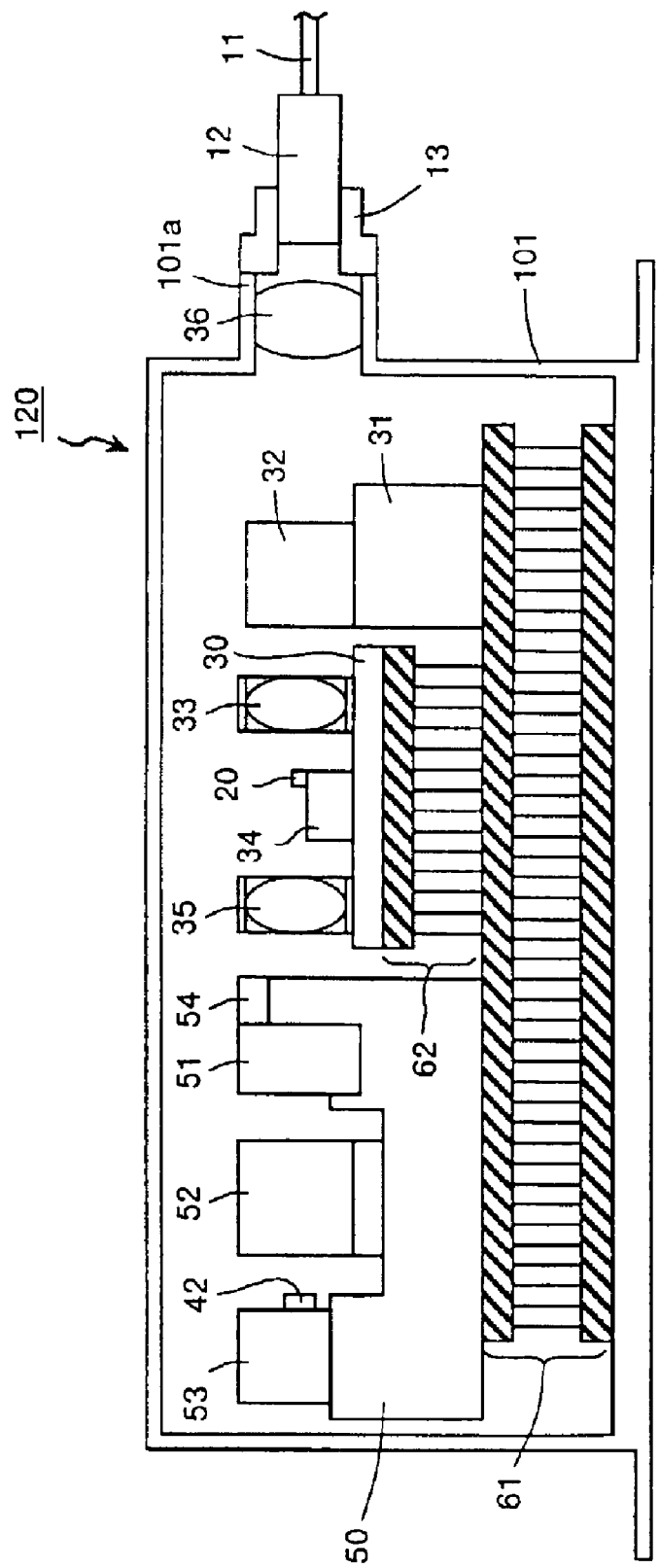
FIG. 12 is a side cross-sectional view that shows a structure of a laser module relating to a modification of the second embodiment.

When the second thermo-module 62 is disposed near the center of the first thermo-module 61 as shown in FIG. 12, the first thermo-module 61 at the lower stage can uniformly absorb heat generated by the second thermo-module 62. Thus, it is possible to effectively utilize the performance of these thermo-modules. Consequently, it is possible to lower the power consumption of the first thermo-module 61. This provides the effect of expanding the temperature variable range with the same power consumption. In other words, it becomes possible to expand the variable range of the oscillation wavelength of the semiconductor laser device 20.

Further, when only the sub-mount 34 that is provided with the semiconductor laser device 20 is mounted on the second thermo-module 62, it becomes possible to lower the power consumption of the second thermo-module 62 as well.

A third embodiment will be explained next. In the second embodiment, the wavelength monitor is structured to use a laser beam that is output from the rear end surface of the semiconductor laser device 20. On the other hand, in the third embodiment, a wavelength monitor is structured to use a laser beam that is output from the front end surface of the semiconductor laser device 20. In the third embodiment, it is preferable that the optical filter 52 is formed with a crystal material that satisfies the expression (1) like in the first and second embodiments. Further, it is preferable that in processing the crystal material, the crystal material is annealed at a high temperature, without carrying out a polarization processing or after carrying out a polarization processing.

Figure 13:
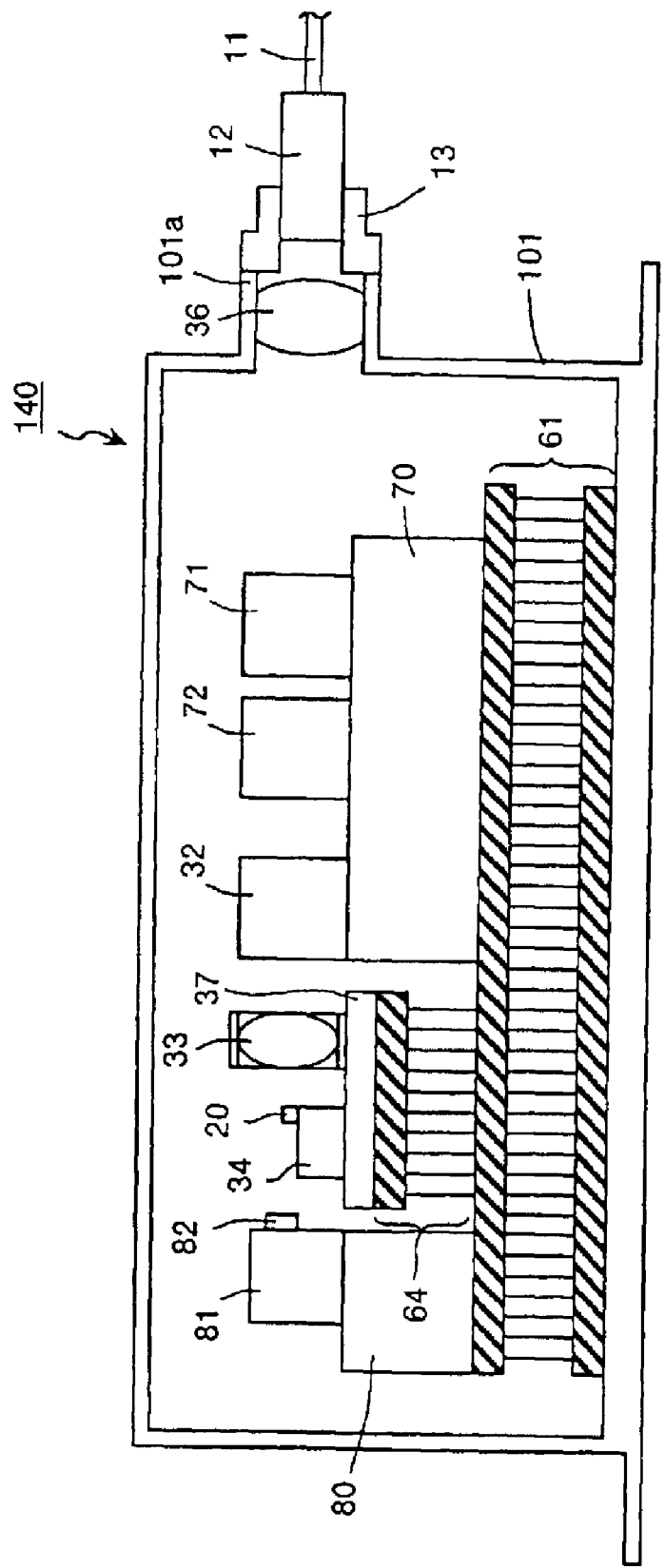
FIG. 13 is a side cross-sectional view that shows a structure of a laser module relating to a third embodiment.

FIG. 13 is a side cross-sectional view of this laser module in a laser beam emission direction. In FIG. 13, sections that are identical with those in FIG. 9 are attached with like reference numbers, and explanation of these sections will be omitted. According to a laser module 140 shown in FIG. 13, a base 80, a second thermo-module 64, and a base 70 are provided on a first thermo-module 61. A sub-mount 81 is provided on a base 80. A photodetector 82 that receives a laser beam emitted from the rear end surface of the semiconductor laser device 20 is provided on the front surface (the surface of a laser beam emission direction) of the sub-mount 81.

A base 37 is disposed on the second thermo-module 64. On this base 37, there are provided a sub-mount 34 that is provided with the semiconductor laser device 20, and a parallel lens 33 that connects a laser beam output from the front end surface of the semiconductor laser device 20 to an optical fiber 11. On the base 70, there are provided an optical isolator 32 that stops a reflection return beam of a condensed beam from the optical fiber 11, a sub-mount 71, and a sub-mount 72.

Figure 14:
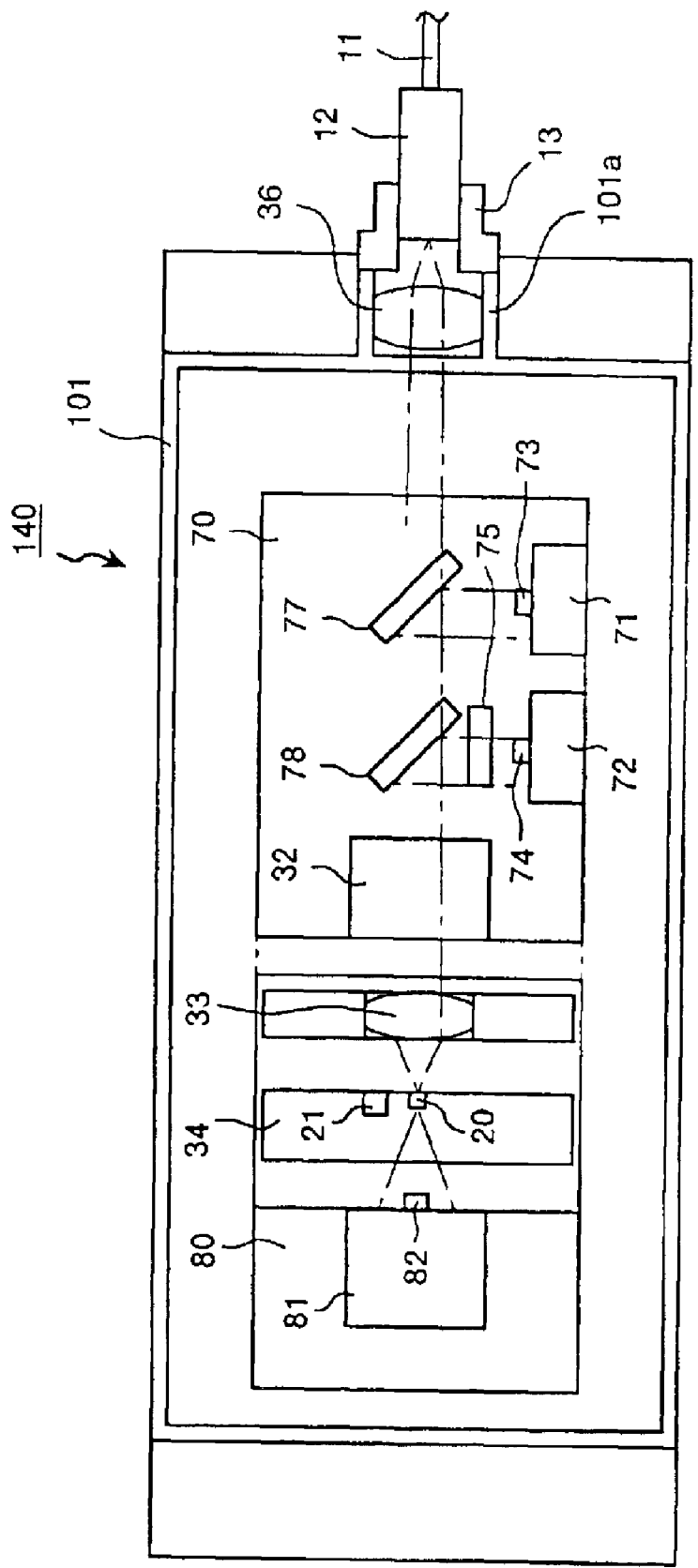
FIG. 14 is a top plan cross-sectional view that shows a structure of the laser module relating to the third embodiment.

FIG. 14 is a top plan cross-sectional view of the laser module in a laser beam emission direction. As shown in FIG. 14, the semiconductor laser device 20 and a thermistor 21 that measures a temperature of the semiconductor laser device 20 are provided on the sub-mount 34. On the base 70 that is positioned on a wavelength monitor, there are provided a half-mirror 78 that transmits a beam that has passed through the optical isolator 32 and also reflects this beam to the sub-mount 72 at an angle of approximately 90 degrees relative to an incident direction of this beam, a half-mirror 77 that transmits a beam that has passed through the half-mirror 78 and also reflects this beam to the sub-mount 71 at an angle of approximately 90 degrees relative to an incident direction of this beam, and an optical filter 75 that makes incident a beam reflected from the half-mirror 78.

A first photodetector 73 that receives a beam reflected from the half-mirror 77 is provided on the front surface of the sub-mount 71. A second photodetector 74 that receives a beam transmitted through the optical filter 75 is provided on the front surface of the sub-mount 72. It is preferable to use photodiode for the first photodetector 73 and the second photodetector 74 respectively.

The first photodetector 41 and the second photodetector 42 shown in FIG. 11 correspond to the first photodetector 73 and the second photodetector 74 respectively, and the temperature control of the laser module 140 is carried out in a similar manner to that explained for the laser module in the second embodiment. Therefore, explanation of the temperature control of the laser module 140 will be omitted. Although not shown in FIG. 14, a thermistor that corresponds to the first thermistor 54 shown in FIG. 11 is disposed near the optical filter 75.

In FIG. 13 and FIG. 14, the photodetector 82 monitors output power of the semiconductor laser device 20, and a detection current is input to the third controller 93 shown in FIG. 11.

According to the laser module relating to the third embodiment, a crystal member that constitutes the optical filter satisfies the condition of the expression (1) like in the first and second embodiments. Therefore, it becomes possible to realize an optical filter that has stable transmission wavelength, with small variation in the transmission wavelength attributable to a temperature variation. As a result, it becomes possible to control in high precision the wavelength of a laser beam that is output from the semiconductor laser device 20, in a similar manner to that of the first and second embodiments.

There are also the following effects that are similar to the effects of the first and second embodiments. It is possible to stabilize the wavelength discrimination characteristics of the optical filter 52 and the optical isolator 32, and this makes it possible to realize wavelength locking in higher precision. It is possible to expand the wavelength variable range of the semiconductor laser device 20. It is possible to make the wavelength monitor small by using a prism.

A fourth embodiment will be explained next. A laser module relating to a fourth embodiment has a heat-insulating or insulating shielding member between the second thermo-module and the base that is disposed in parallel with the second thermo-module in the second embodiment.

Figure 15:
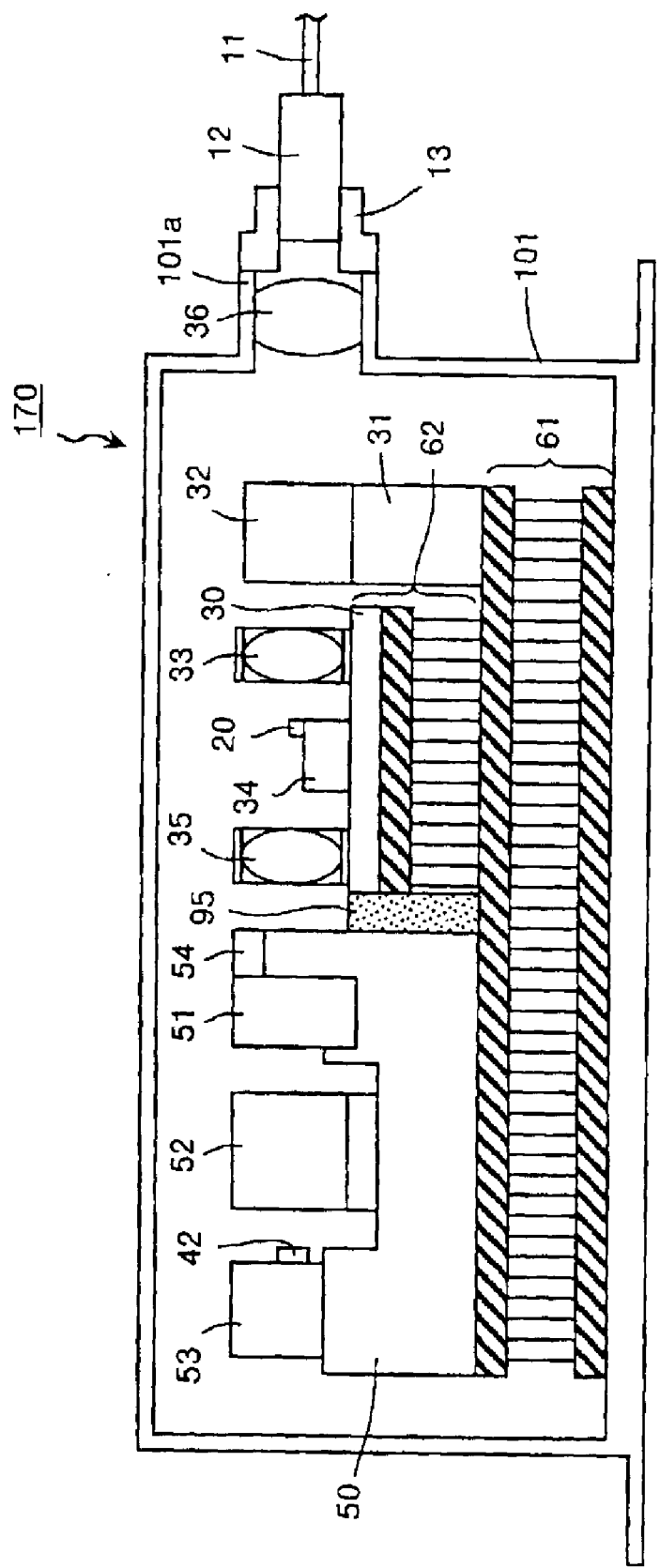
FIG. 15 is a side cross-sectional view that shows a structure of a laser module relating to a fourth embodiment.
Figure 16:
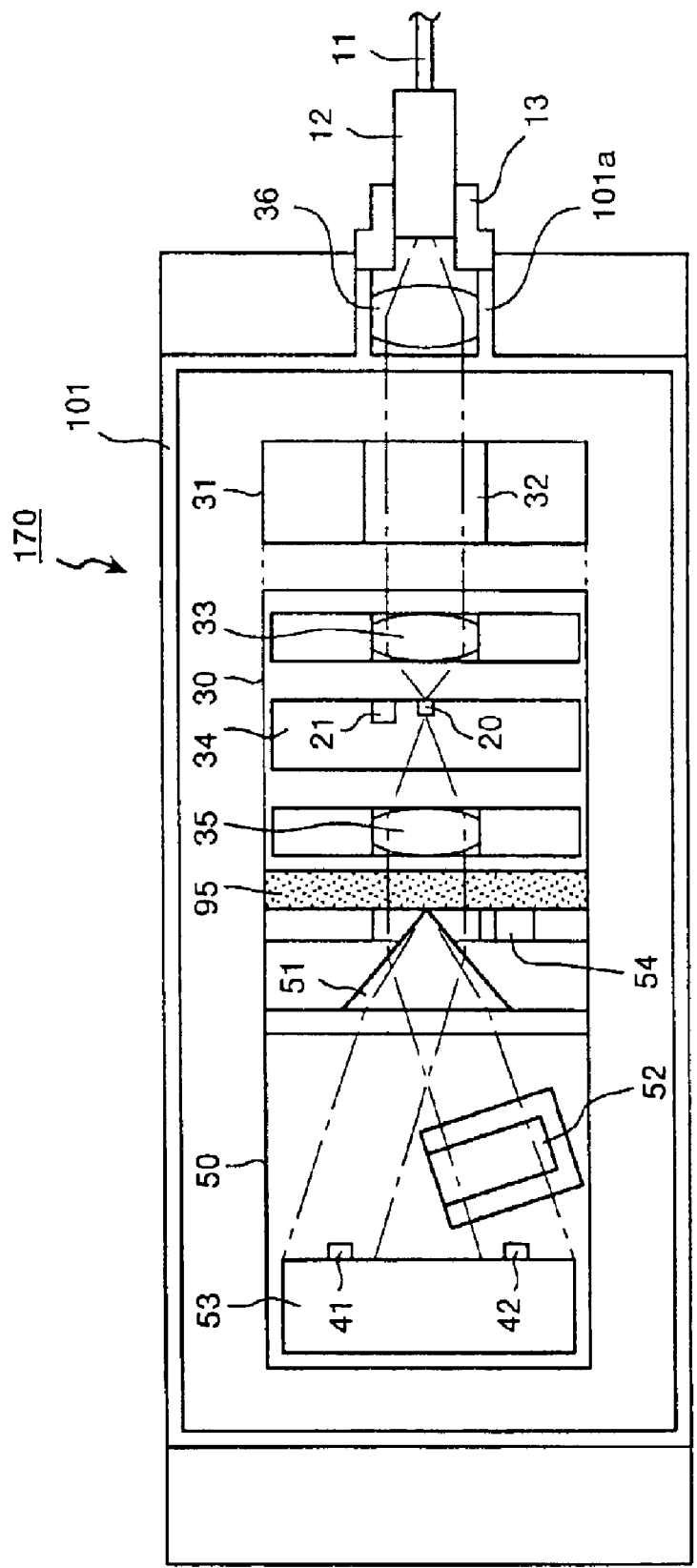
FIG. 16 is a top plan cross-sectional view that shows a structure of the laser module relating to the fourth embodiment.

FIG. 15 is a side cross-sectional view of this laser module in a laser beam emission direction. In FIG. 15, sections that are identical with those in FIG. 9 are attached with like reference numbers, and explanation of these sections will be omitted. FIG. 16 is a top plan cross-sectional view of this laser module in a laser beam emission direction. In FIG. 16, sections that are identical with those in FIG. 2 are attached with like reference numbers, and explanation of these sections will be omitted. In the fourth embodiment, it is preferable that an optical filter 52 is formed with a crystal material that satisfies the expression (1) like in the first to third embodiments. Further, it is preferable that in processing the crystal material, the crystal material is annealed at a high temperature, without carrying out a polarization processing or after carrying out a polarization processing.

The structures shown in FIG. 15 and FIG. 16 are different from those shown in FIG. 9 and FIG. 2 in that a shielding member 95, with any one of insulating characteristic or heat-insulating characteristic or both, is fixedly disposed between a second thermo-module 62 and a base 50 as a wavelength monitor.

For example, when the shielding member 95 is formed with an insulating material, it is possible to prevent the second thermo-module 62 and the base 50 from being electrically contacted and short-circuited. When the shielding member 95 is formed with a heat-insulating material, it is possible to prevent a variation in the wavelength-versus-optical transmission characteristics of the optical filter 52 attributable to the transmission of heat generated in the second thermo-module 62 to the optical filter 52 via the base 50 as the wavelength monitor.

For the insulating material, it is possible to use any one of ceramics or resins such as glass epoxy resin (glass fiber+ epoxy resin), paper phenol resin, polyimide, mica, glass, epoxy resin, polyethylene, and TEFLON (a registered trademark). For the heat-insulating material, it is possible to use any one of porous materials such as glass fiber, ceramic fiber, rock wool, foamed cement, hollow glass beads, foamed urethane, and foamed polystyrene. For the shielding member 95, it is preferable to use a material that has both insulation and heat-insulation characteristics. The above materials have both characteristics in substantially all applications.

It is also possible to fixedly provide the shielding member 95 between a base 31 on which an optical isolator 32 is provided and the second thermo-module 62.

As explained above, according to the fourth embodiment, an insulating or heat-insulating material is fixedly disposed between the second thermo-module 62 and the part disposed in parallel adjacent to this second thermo-module 62. Therefore, it is possible to prevent electric short-circuiting or unnecessary heat conduction between the two. As a result, it becomes possible to achieve highly reliable operation or reduction in power consumption of the second thermo-module.

According to the fourth embodiment, an optical filter 75 is formed with a crystal material that satisfies the expression (1). Therefore, the transmission wavelength characteristic of the optical filter 75 has low temperature-dependency, and a change in the transmission wavelength attributable to a temperature change becomes smaller than the transmission wavelength of a conventional optical filter. Consequently, it is possible to realize wavelength locking more precisely than according to a conventional practice, in a similar manner to that of the first to third embodiments.

In the above example, the shielding member 95 is used in the structure shown in FIG. 9. It is needless to mention that it is also possible to reduce sizes of the laser module by disposing the shielding member to other structures. For example, it is possible to fixedly sandwich the member 95 between the first thermo-module 63 and the second thermo-module 64 in the structure shown in FIG. 1.

While a prism or a half-mirror is used as one example of a beam splitter in the above embodiments, it is also possible to use other beam splitters.

Figure 17:
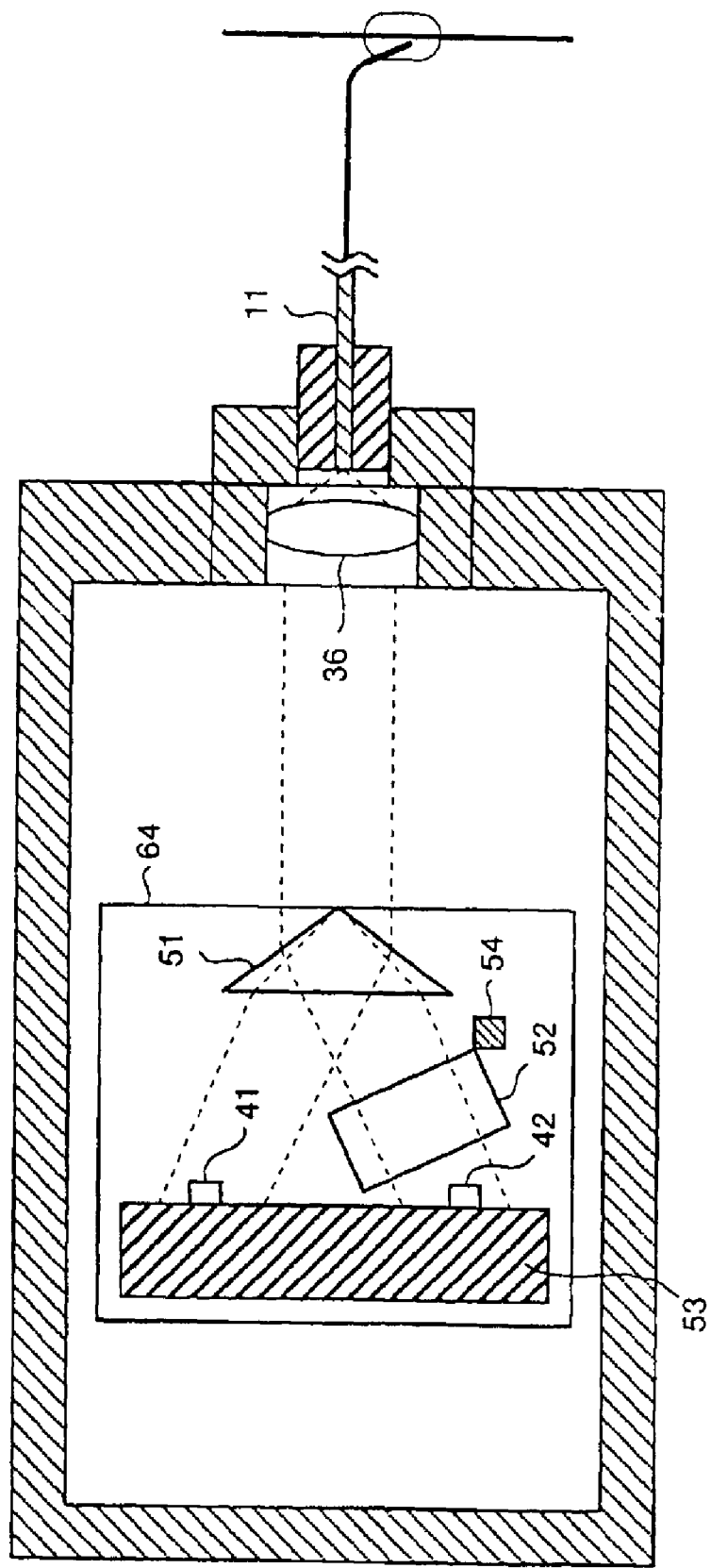
FIG. 17 is a top plan cross-sectional view that shows a structure of a wavelength locker module relating to a fifth embodiment.
Figure 18:
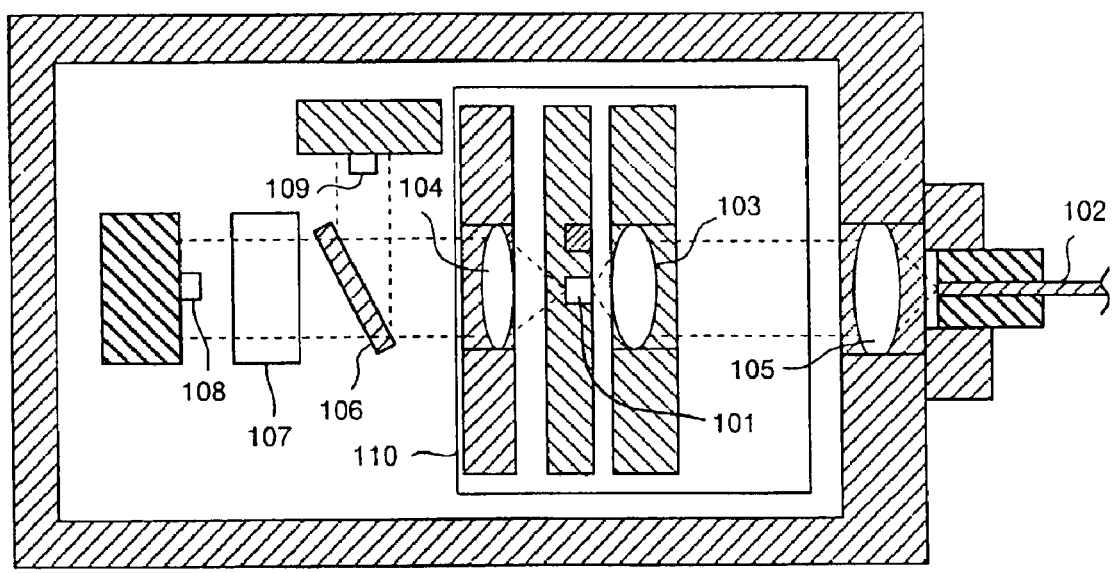
FIG. 18 is a top plan cross-sectional view that shows a structure of a conventional laser module.

A fifth embodiment will be explained next. In the first to fourth embodiments, semiconductor laser device modules that incorporate an integrated structure of structural members such as an optical system that is relevant to the semiconductor laser device 20 have been explained. In the fifth embodiment, a wavelength locker module of an external type that is structured separately from the semiconductor laser device or the like will be explained. FIG. 17 is a view that shows a structure of a wavelength locker module relating to the fifth embodiment. The wavelength locker module shown in FIG. 17 is constructed of an optical fiber 11, a parallel lens 36, a prism 51, an optical filter 52, a first photodiode 42, a second photodiode 41, a temperature controller 64, and a temperature sensor 54. These constituent members are integrally fitted in a package. Inside the wavelength locker module, there is disposed a carrier 53 that holds the first photodiode 42 and the second photodiode 41.

In the above structure, a laser beam of which wavelength is to be monitored by the wavelength locker module is transmitted from a temperature-controllable semiconductor laser device that is provided at the outside of a wavelength module 2, via the optical fiber 11. The laser beam from the optical fiber 11 is changed into a parallel beam by a parallel lens 36, and this parallel beam is directly incident to the prism 51. Thereafter, the wavelength of the laser beam is monitored according to the operation similar to that of the structure shown in FIG. 1, based on each photo detection current of the prism 51, the optical filter 52, the first photodiode 42, and the second photodiode 41. The prism 51, the first photodiode 42, the second photodiode 41, the temperature controller 64, and the temperature sensor 54 that are included in the wavelength locker 2 may be prepared using members similar to those of the corresponding constituent members shown in FIG. 1, and thus explanation of these materials will be omitted.

In the fifth embodiment, the optical filter 52 is formed with a crystal member that satisfies the expression (1). Therefore, the temperature dependency of the wavelength of a beam that is transmitted through the optical filter 52 is small, like in the first to fourth embodiments. It is possible to detect in high precision a deviation of the wavelength of a laser beam that is transmitted from the outside. Therefore, it becomes possible to properly control the temperature of the semiconductor laser device, and it becomes possible to achieve wavelength locking in high precision.

While the present invention has been explained according to the first to fifth embodiments, the present invention is not limited to the structures explained in these embodiments. It is also possible to modify the invention in various ways. For example, it is possible to use the optical filter relating to the present invention as a loss compensation filter in an optical communication system. In the optical communication system, optical loss during an optical transmission has wavelength dependency. Therefore, when an optical transmission is carried out in the WDM system, for example, intensity deviation occurs between optical signals that are transmitted in mutually different wavelengths. In order to flatten the intensity of the optical signals by compensating for the intensity deviation, generally a loss compensation filter is disposed in the optical communication system. When the optical filter that satisfies the condition of the expression (1) is used for the loss compensation filter, the wavelength transmission characteristics of the optical filter has low dependency on a temperature change, and the transmission wavelength has small variation. Therefore, it becomes possible to carry out stable loss compensation.

As explained above, according to the present embodiment, the optical filter is structured with a crystal member that has small change in the optical length attributable to a temperature change. Therefore, when the semiconductor laser module is used under a condition of small wavelength intervals between optical signals, there is an effect that it is possible to achieve stable wavelength locking in high precision even when there is a large temperature change.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An optical filter comprising a crystal member that satisfies a condition that $\alpha+(1/n_0)\times(\Delta n/\Delta T)$ becomes not more than $2.3\times10^{-6}/\deg$, where $\alpha$ represents a coefficient of linear expansion, $n_0$ represents a refractive index at a normal temperature of $20\pm15°$ C., and $\Delta n$ represents a change of a refractive index corresponding to a temperature variation $\Delta T$.

2. The optical filter according to claim 1, wherein the crystal member has been formed with $LiTaO_3$.

3. The optical filter according to claim 1, wherein the crystal member has substantially zero dipole moment as a whole.

4. The optical filter according to claim 1, wherein the crystal member is annealed at a temperature lower than a Curie point.

5. The optical filter according to claim 1, wherein the crystal member is annealed at a temperature not lower than a Curie point after polarization.

6. The optical filter according to claim 1, wherein the crystal member is formed with any one of $LiNbO_3$, $Bi_{12}GeO_{20}$, $Gd_3Ga_5O_{12}$, and $TeO_2$.

7. A laser module comprising:

a semiconductor laser device that outputs a laser beam;

an optical fiber that condenses a laser beam output from the semiconductor laser device and transmits the laser beam to the outside;

an optical branching unit that makes a wavelength-monitoring laser beam incident out of a laser beam emitted from the semiconductor laser device, and branches the wavelength-monitoring laser beam into a first branch beam and a second branch beam;

an optical filter that includes a crystal member that makes the first branch beam generate a Farby-Perot resonance to selectively transmit a predetermined wavelength band, and that satisfies a condition that $\alpha+(1/n_0)\times(\Delta n/\Delta T)$ becomes not more than $2.3\times10^{-6}$/deg, where $\alpha$ represents a coefficient of linear expansion, $n_o$ represents a refractive index at a normal temperature of $20\pm15°$ C., and $\Delta n$ represents a change of a refractive index corresponding to a temperature variation $\Delta T$;

a first light amount detecting unit that receives a transmission beam of the optical filter; and a second light amount detecting unit that receives the second branch beam, wherein the optical branch unit branches the wavelength-monitoring laser beam into a first branch beam and a second branch beam using a prism to guide the first branch beam and the second branch beam, and the first light amount detecting unit and the second light amount detecting unit is mounted on a submount adjacent to each other.

8. The laser module according to claim 7, further comprising:

a first lens and a second lens that make a beam output from the front emission end surface of the semiconductor laser device incident to the optical fiber.

9. The laser module according to claim 7, further comprising:

an optical isolator arranged between the first lens and the second lens.

10. The laser module according to claim 7, further comprising:

a temperature detector that detects a change in the temperature of the optical filter, and that carries out a temperature control to make the temperature of the optical filter constant.

11. The laser module according to claim 7, further comprising:

a first temperature adjustor, and a second temperature adjustor that is fixed on the first temperature adjustor, wherein the wavelength monitor is fixed on the first temperature adjustor, and the semiconductor laser device is fixed on the second temperature adjustor.

12. A wavelength locker comprising:

an optical branching unit that makes a wavelength-monitoring laser beam incident, and branches the wavelength-monitoring laser beam into a first branch beam and a second branch beam;

an optical filter that includes a crystal member that makes the first branch beam generate a Farby-Perot resonance to selectively transmit a predetermined wavelength band, and that satisfies a condition that $\alpha+(1/n_0)\times(\Delta n/\Delta T)$ becomes not more than $2.3\times10^{-6}$/deg, where $\alpha$ represents a coefficient of linear expansion, $n_o$ represents a refractive index at a normal temperature of $20\pm15°$ C., and $\Delta n$ represents a change of a refractive index corresponding to a temperature variation $\Delta T$;

a first light amount detecting unit that receives a transmission beam of the optical filter, and a second light amount detecting unit that receives the second branch beam, wherein the first light amount detecting unit and the second light amount detecting unit is mounted on a submount adjacent to each other, and the optical branch unit branches the wavelength-monitoring laser beam into a first branch beam and a second branch beam using a prism to direct the first branch beam and the second branch beam respectively to the first light amount detecting unit and the second light amount detecting unit mounted on a submount.

13. The laser module of claim 7, wherein said prism 15 configured to guide the first branch beam and the second branch beam in directions opposite to the optical fiber.

* * * * *